United States Patent
Lille

(10) Patent No.: US 7,636,223 B2
(45) Date of Patent: Dec. 22, 2009

(54) THREE TERMINAL MAGNETIC SENSOR HAVING AN IN-STACK LONGITUDINAL BIASING LAYER STRUCTURE AND A SELF-PINNED LAYER STRUCTURE

(75) Inventor: Jeffrey S. Lille, Sunnyvale, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 311 days.

(21) Appl. No.: 11/032,491

(22) Filed: Jan. 10, 2005

(65) Prior Publication Data
US 2006/0152858 A1  Jul. 13, 2006

(51) Int. Cl.
G11B 5/33 (2006.01)
(52) U.S. Cl. ............ 360/324.2; 360/320; 360/322
(58) Field of Classification Search .......... 360/324.2, 360/320, 322
See application file for complete search history.

(56) References Cited

U.S. PATENT DOCUMENTS

| | | | |
|---|---|---|---|
| 5,416,353 A | 5/1995 | Kamiguchi et al. | |
| 5,432,373 A | 7/1995 | Johnson | |
| 5,747,859 A | 5/1998 | Mizushima et al. | |
| 5,973,334 A * | 10/1999 | Mizushima et al. | 257/25 |
| 6,023,395 A | 2/2000 | Dill et al. | |
| 6,185,079 B1 * | 2/2001 | Gill | 360/324.2 |
| 6,201,259 B1 | 3/2001 | Sato et al. | |
| 6,243,288 B1 * | 6/2001 | Ishikawa et al. | 365/158 |
| 6,438,026 B2 | 8/2002 | Gillies et al. | |
| 6,473,279 B2 | 10/2002 | Smith et al. | |

(Continued)

FOREIGN PATENT DOCUMENTS

JP  9181374  7/1997

(Continued)

OTHER PUBLICATIONS

"The American Physical Society", "Perpendicular Hot Electron Spin-Valve Effect in a New Magnetic Field Sensor: The Spin-Valve Transistor", "Physical Review Letters", Jun. 26, 1995, pp. 5260-5263, vol. 74 #26.

(Continued)

*Primary Examiner*—Andrea L Wellington
*Assistant Examiner*—Carlos E Garcia
(74) *Attorney, Agent, or Firm*—John J. Oskorep, Esq.; Rambod Nader

(57) ABSTRACT

In one illustrative example, a three terminal magnetic sensor (TTM) has a sensor stack structure which includes a base region, a collector region, and an emitter region. A first barrier layer is located between the emitter region and the base region, and a second barrier layer is located between the collector region and the base region. A plurality of terminals of the TTM include a base lead coupled to the base region, a collector lead coupled to the collector region, and an emitter lead coupled to the emitter region. The collector region is or includes a layer of semiconductor material. The base region includes a free layer structure. The TTM further includes a self-pinned layer structure and an in-stack longitudinal biasing layer (LBL) structure formed in stack with the sensor stack structure, with a magnetic moment that is parallel to a sensing plane of the TTM for magnetically biasing the free layer structure.

31 Claims, 26 Drawing Sheets

U.S. PATENT DOCUMENTS

| | | | |
|---|---|---|---|
| 6,480,365 B1* | 11/2002 | Gill et al. | 360/324.11 |
| 6,501,143 B2 | 12/2002 | Sato et al. | |
| 6,577,476 B1 | 6/2003 | Childress et al. | |
| 6,680,832 B2 | 1/2004 | Fontana, Jr. et al. | |
| 6,704,175 B2 | 3/2004 | Li et al. | |
| 6,724,586 B2 | 4/2004 | Gill | |
| 6,741,432 B2 | 5/2004 | Pinarbasi | |
| 6,781,798 B2* | 8/2004 | Gill | 360/314 |
| 6,919,213 B2* | 7/2005 | Flatte et al. | 438/3 |
| 7,336,449 B2 | 2/2008 | Lille | |
| 2002/0024778 A1 | 2/2002 | Xue et al. | |
| 2003/0122208 A1 | 7/2003 | Sato et al. | |
| 2003/0164509 A1 | 9/2003 | Gregg | |
| 2003/0179514 A1* | 9/2003 | Pinarbasi | 360/324.11 |
| 2003/0214004 A1 | 11/2003 | Sato et al. | |
| 2003/0214763 A1 | 11/2003 | Childress et al. | |
| 2003/0227722 A1* | 12/2003 | Freitag et al. | 360/324.11 |
| 2003/0235016 A1 | 12/2003 | Gill | |
| 2004/0008454 A1 | 1/2004 | Gill | |
| 2004/0061154 A1 | 4/2004 | Huai et al. | |
| 2004/0061977 A1* | 4/2004 | Freitag et al. | 360/314 |
| 2004/0109264 A1* | 6/2004 | Gill | 360/324.2 |
| 2005/0002132 A1* | 1/2005 | Gill | 360/324.12 |
| 2005/0068693 A1* | 3/2005 | Freitag et al. | 360/324.11 |
| 2006/0152857 A1 | 7/2006 | Childress et al. | |
| 2006/0152859 A1 | 7/2006 | Childress et al. | |

FOREIGN PATENT DOCUMENTS

| | | |
|---|---|---|
| JP | 9307156 | 11/1997 |
| JP | 11204854 | 7/1999 |
| JP | 2003289163 | 10/2003 |
| WO | WO 96/07208 | 3/1996 |

OTHER PUBLICATIONS

D.J. Monsma et al., Perpendicular Hot Electron Spin-Valve Effect in a New Magnetic Field Sensor: The Spin-Valve Transistor, Physical Review Letters, Jun. 26, 1995, vol. 74—No. 26.

Amendment submitted on May 11, 2009 for U.S. Appl. No. 11/032,598, filed Jan. 10, 2005.

* cited by examiner

- PRIOR ART -

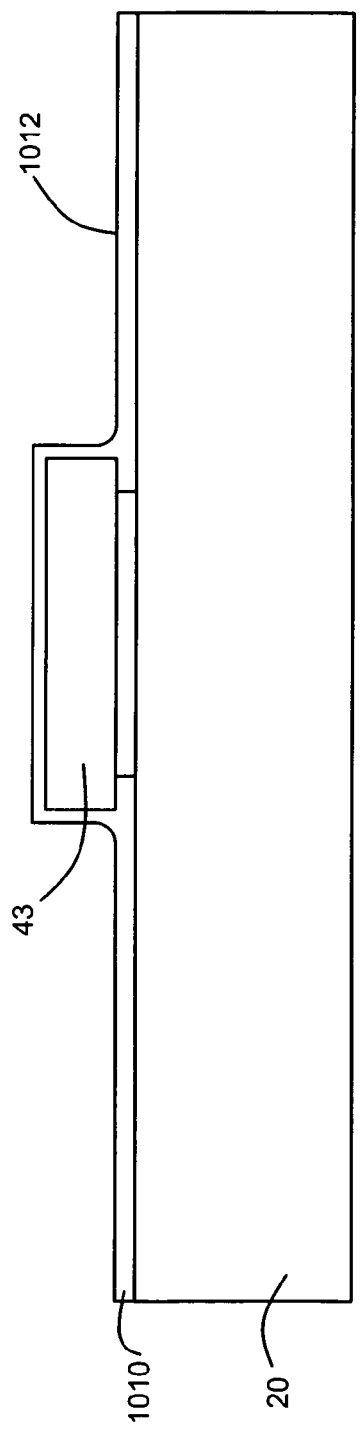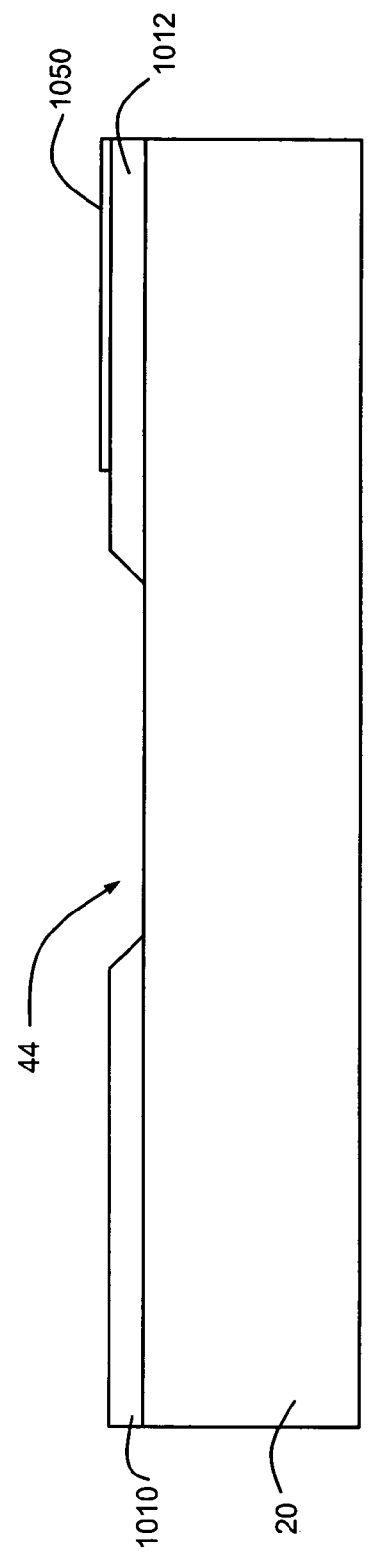
FIG. 12A
FIG. 12B

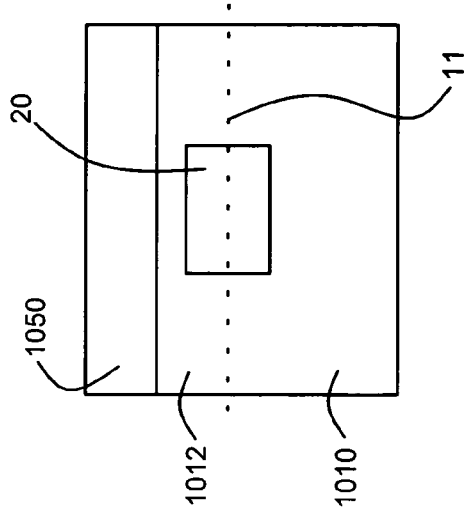
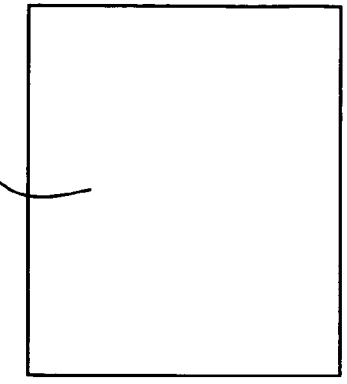
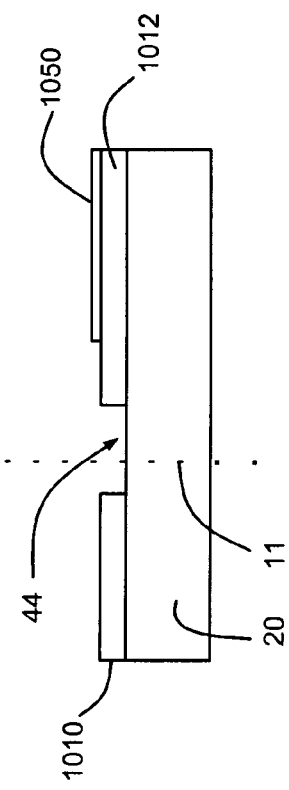
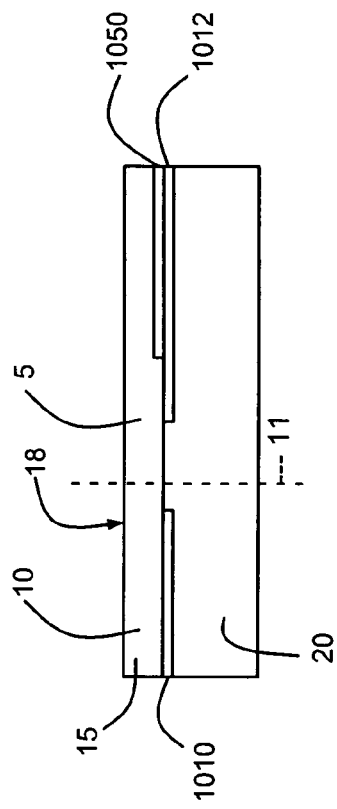

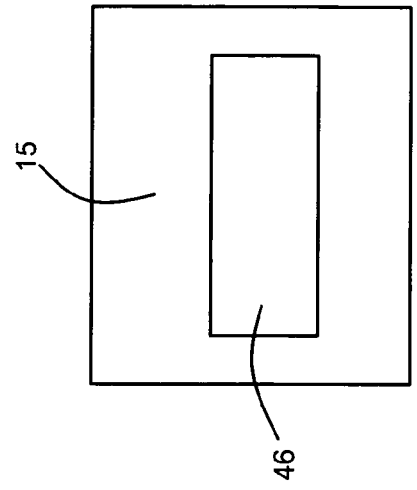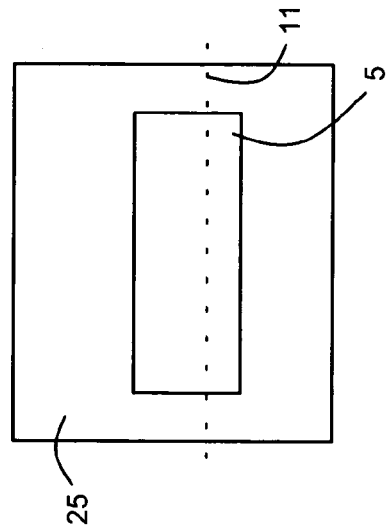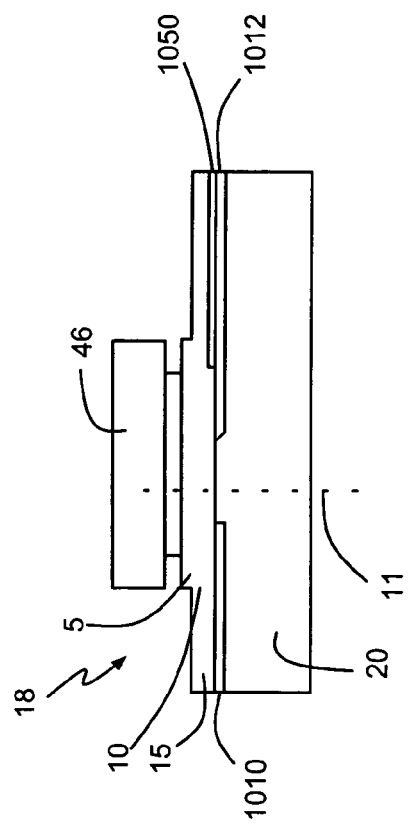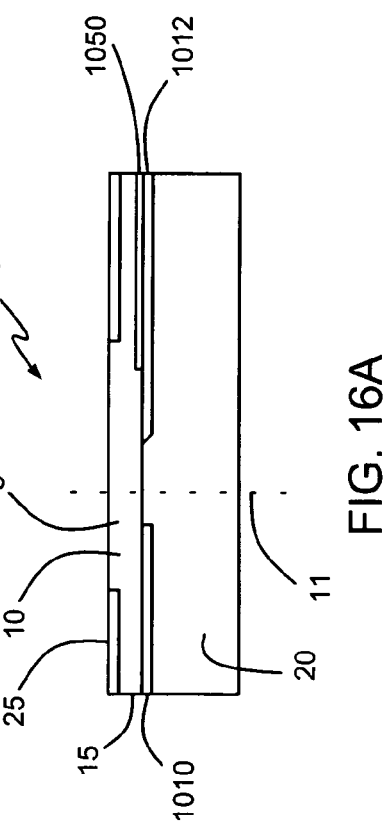
FIG. 15A
FIG. 15B
FIG. 16A
FIG. 16B

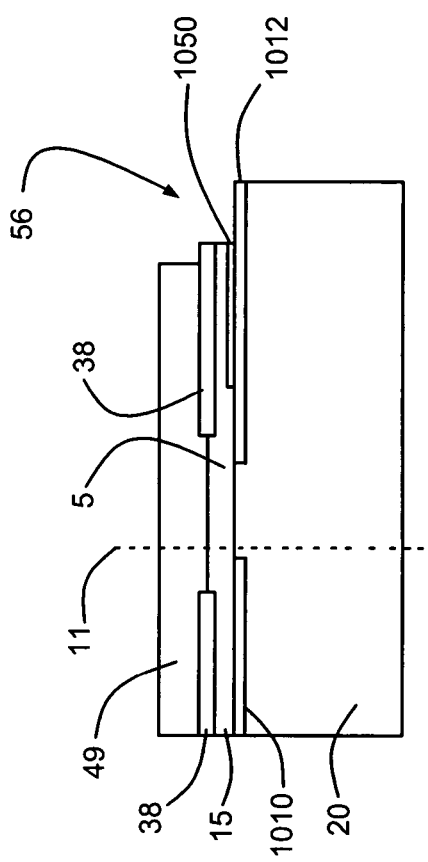
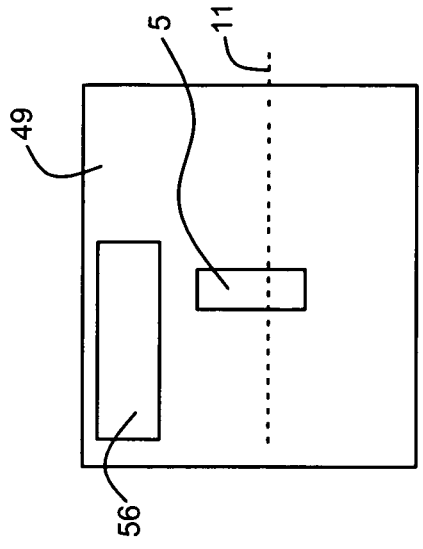
FIG. 20A
FIG. 20B
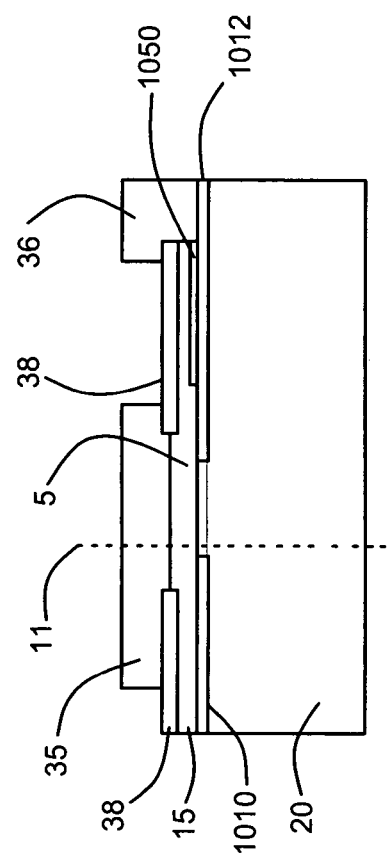
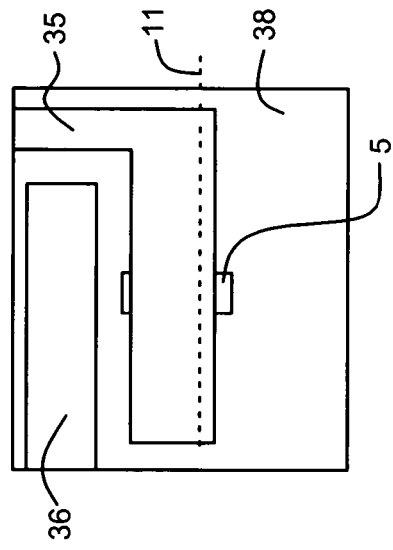
FIG. 21A
FIG. 21B

THREE TERMINAL MAGNETIC SENSOR HAVING AN IN-STACK LONGITUDINAL BIASING LAYER STRUCTURE AND A SELF-PINNED LAYER STRUCTURE

BACKGROUND

1. Field of the Technology

This invention relates generally to three terminal magnetic sensors (TTMs) suitable for use in magnetic heads, which includes spin valve transistors (SVTs), magnetic tunnel transistors (MTTs), or double junction structures.

2. Description of the Related Art

Magnetoresistive (MR) sensors have typically been used as read sensors in hard disk drives. An MR sensor detects magnetic field signals through the resistance changes of a read element, fabricated of a magnetic material, as a function of the strength and direction of magnetic flux being sensed by the read element. The conventional MR sensor, such as that used as a MR read head for reading data in magnetic recording disk drives, operates on the basis of the anisotropic magnetoresistive (AMR) effect of the bulk magnetic material, which is typically permalloy. A component of the read element resistance varies as the square of the cosine of the angle between the magnetization direction in the read element and the direction of sense current through the read element. Recorded data can be read from a magnetic medium, such as the disk in a disk drive, because the external field from the recorded magnetic medium (the signal field) causes a change in the direction of magnetization in the read element, which causes a change in resistance of the read element and a resulting change in the sensed current or voltage.

A three terminal magnetic sensor (TTM) of a magnetic head may comprise a spin valve transistor (SVT), for example, which is a vertical spin injection device having electrons injected over a barrier layer into a free layer. The electrons undergo spin-dependent scattering, and those that are only weakly scattered retain sufficient energy to traverse a second barrier. The current over the second barrier is referred to as the magneto-current. Conventional SVTs are constructed using a traditional three-terminal framework having an "emitter-base-collector" structure of a bipolar transistor. SVTs further include a spin valve (SV) on a metallic base region, whereby the collector current is controlled by the magnetic state of the base region using spin-dependent scattering. Although the TTM may involve an SVT where both barrier layers are Schottky barriers, the TTM may alternatively incorporate a magnetic tunnel transistor (MTT) where one of the barrier layers is a Schottky barrier and the other barrier layer is a tunnel barrier, or a double junction structure where both barrier layers are tunnel barriers.

Since it is advantageous to form a very thin base region for increased areal recording densities, it has been identified that the base region in the TTM will have a relatively large electrical resistance. Given an estimated trackwidth (TW) of approximately 50 nanometers (nm) for a magnetic head, for example, the electrical resistance of the base region may be much greater than 100 Ω. Thus, as the sense current passes through the base region from the emitter lead to the base lead, the base region may be prone to failure or damage (e.g. it could "blow" like a fuse). Further, a relatively large resistance for the base region raises the noise floor for the TTM, such that a much larger input signal would be required for suitable operation.

Another important consideration is that the free layer should be longitudinally biased parallel to the sensing (or ABS) plane and parallel to the major planes of the thin film layers of the TTM, such that the free layer is magnetically stabilized. This has been typically accomplished by first and second hard bias magnetic layers which are adjacent to first and second sides of the TTM. Unfortunately, the magnetic field through the free layer between the first and second sides is not uniform since a portion of the magnetization is lost in a central region of the free layer to the shields. This is especially troublesome when the track width of the TTM may be in sub-micron dimensions. End portions of the free layer which abut the hard bias layers may be over-biased and become very magnetically stiff in their response to field signals from the moving media. The stiffened end portions can take up a large portion of the total length of the TTM and can significantly reduce the signal amplitude of the TTM.

Accordingly, there is a need to solve these problems so that TTMs may be suitable for use in magnetic heads and other devices.

SUMMARY

In one illustrative example, a three terminal magnetic sensor (TTM) has a sensor stack structure which includes a base region, a collector region, and an emitter region. A sensing plane is defined along sides of the base region, the collector region, and the emitter region. A first barrier layer is located between the emitter region and the base region, and a second barrier layer is located between the collector region and the base region. A plurality of terminals of the TTM include a base lead coupled to the base region, a collector lead coupled to the collector region, and an emitter lead coupled to the emitter region. The collector region is or includes a layer of semiconductor material. The base region includes a free layer structure. The TTM further includes a self-pinned layer structure and an in-stack longitudinal biasing layer (LBL) structure formed in stack with the sensor stack structure, with a magnetic moment that is parallel to a sensing plane of the TTM for magnetically biasing the free layer structure. The TTM may comprise a spin valve transistor (SVT), a magnetic tunnel transistor (MTT), or a double junction structure.

BRIEF DESCRIPTION OF THE DRAWINGS

Other objects and advantages of the invention will become more apparent to those skilled in the art after considering the following detailed description in connection with the accompanying drawings.

FIGS. 12A-21B are illustrations of a TTM being fabricated according to a particular method, preferably in the order presented.

DETAILED DESCRIPTION OF THE PREFERRED EMBODIMENTS

In one illustrative example, a three terminal magnetic sensor (TTM) has a base region, a collector region, and an emitter region. A sensing plane is defined along sides of the base region, the collector region, and the emitter region. A first barrier layer is located between the emitter region and the base region, and a second barrier layer is located between the collector region and the base region. The base region includes a free layer structure. The TTM further includes a self-pinned layer structure and an in-stack longitudinal biasing layer (LBL) structure which magnetically biases the free layer structure. The TTM may comprise a spin valve transistor (SVT), a magnetic tunnel transistor (MTT), or a double junction structure.

The following description is the best embodiment presently contemplated for carrying out the present invention. This description is made for the purpose of illustrating the general principles of the present invention and is not meant to limit the inventive concepts claimed herein.

Figure 1:
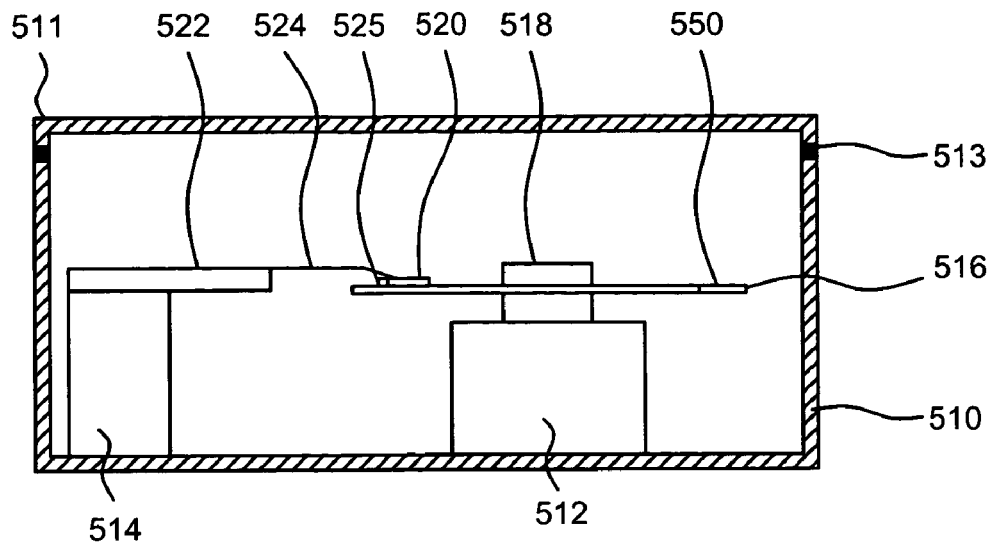
FIG. 1 is a cross-sectional view of a disk drive which may embody a magnetic head having a three terminal magnetic sensor (TTM) comprising a spin valve transistor (SVT)
Figure 2:
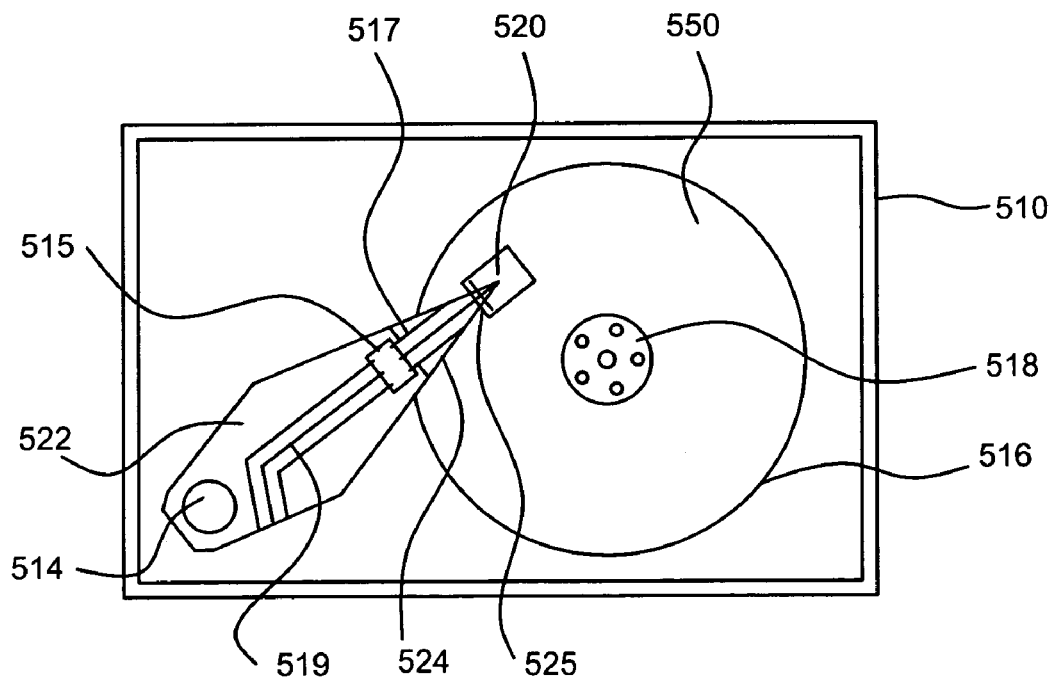
FIG. 2 is a top-down view of the disk drive of FIG. 1.

FIG. 1 is a simplified block diagram of a conventional magnetic recording disk drive for use with a three terminal magnetic sensor (TTM) of a magnetic head. FIG. 2 is a top view of the disk drive of FIG. 1 with the cover removed. Referring first to FIG. 1, there is illustrated in a sectional view a schematic of a conventional disk drive of the type using a TTM. The disk drive comprises a base 510 to which are secured a disk drive motor 512 and an actuator 514, and a cover 511. Base 510 and cover 511 provide a substantially sealed housing for the disk drive. Typically, there is a gasket 513 located between base 510 and cover 511 and a small breather port (not shown) for equalizing pressure between the interior of the disk drive and the outside environment. A magnetic recording disk 516 is connected to drive motor 512 by means of a hub 518 to which it is attached for rotation by drive motor 512. A thin lubricant film 550 is maintained on the surface of disk 516. A read/write head or transducer 525 is formed on the trailing end of a carrier, such as an air-bearing slider 520. Transducer 525 is a read/write head comprising an inductive write head portion and a read head portion. Slider 520 is connected to actuator 514 by means of a rigid arm 522 and a suspension 524. Suspension 524 provides a biasing force which urges slider 520 onto the surface of the recording disk 516. During operation of the disk drive, drive motor 512 rotates disk 516 at a constant speed, and actuator 514, which is typically a linear or rotary voice coil motor (VCM), moves slider 520 generally radially across the surface of disk 516 so that read/write head 525 may access different data tracks on disk 516.

FIG. 2 illustrates in better detail suspension 524 which provides a force to slider 520 to urge it toward disk 516. Suspension 524 may be a conventional type of suspension, such as the well-known Watrous suspension, as described in U.S. Pat. No. 4,167,765. This type of suspension also provides a gimbaled attachment of the slider which allows the slider to pitch and roll as it rides on the air bearing surface. The data detected from disk 516 by transducer 525 is processed into a data readback signal by signal amplification and processing circuitry in an integrated circuit chip 515 located on arm 522. The signals from transducer 525 travel via a flex cable 517 to chip 515, which sends its output signals to the disk drive electronics (not shown) via cable 519.

Figure 3:
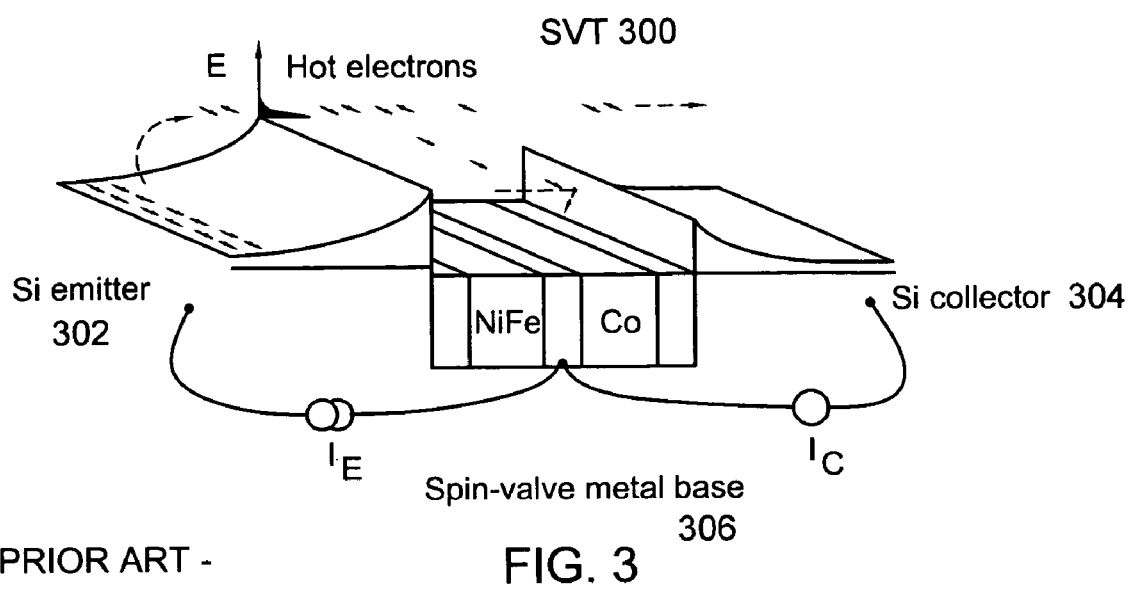
FIG. 3 is an illustration for general SVT operation.

FIG. 3 illustrates TTM operation associated with a spin valve transistor (SVT) 300 which has a semiconductor emitter region 302, a semiconductor collector region 304, and a base region 306 which contains a spin valve (SV). The semiconductors and magnetic materials used in SVT 300 may include an n-type silicon (Si) material for emitter 302 and collector 304, and a $Ni_{80}Fe_{20}/Au/Co$ spin valve for the region 306. Energy barriers, also referred to as Schottky barriers, are formed at the junctions, between the metal base 306 and the semiconductors. It is desirable to obtain a high quality energy barrier at these junctions with good rectifying behavior. Therefore, thin layers of materials (e.g. platinum and gold) are oftentimes used at the emitter 302 and collector 304, respectively. Moreover, these thin layers separate the magnetic layers from the semiconductor materials.

A TTM operates when current is introduced between emitter region 302 and base region 306, denoted as $I_E$ in FIG. 3. This occurs when electrons are injected over the energy barrier and into base region 306 by biasing the emitter such that the electrons are traveling perpendicular to the layers of the spin valve. Because the electrons are injected over the energy barrier, they enter base region 306 as non-equilibrium hot electrons, whereby the hot-electron energy is typically in the range of 0.5 and 1.0 eV depending upon the selection of the metal/semiconductor combination. The energy and momentum distribution of the hot electrons change as the electrons move through base region 306 and are subjected to inelastic and elastic scattering. As such, electrons are prevented from entering collector region 304 if their energy is insufficient to overcome the energy barrier at the collector side. Moreover, the hot-electron momentum must match with the available states in the collector semiconductor to allow for the electrons to enter collector region 304. The collector current $I_C$, which indicates the fraction of electrons collected in collector region 304, is dependent upon the scattering in base region 306 which is spin-dependent when base region 306 contains magnetic materials. Furthermore, an external applied magnetic field controls the total scattering rate which may, for example, change the relative magnetic alignment of the two ferromagnetic layers of the spin valve. The magnetocurrent (MC), which is the magnetic response of the TTM, can be represented by the change in collector current normalized to the minimum value as provided by the following formula: $MC=[I^P_C-I^{AP}_C]/I^{AP}_C$, where P and AP indicate the parallel and antiparallel state of the spin valve, respectively.

Figure 4:
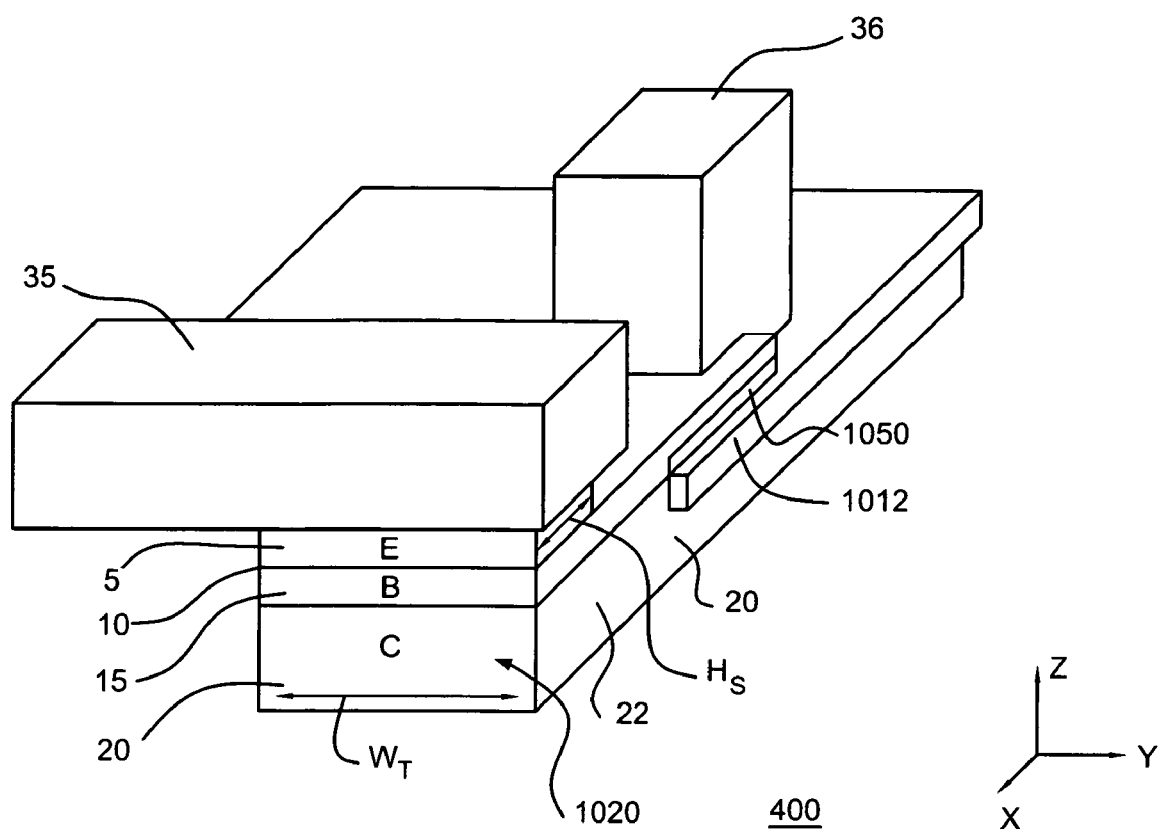
FIG. 4 is a perspective view of a TTM having a metal layer formed so as to reduce the base resistance.

In FIG. 4, a three terminal magnetic sensor (TTM) 400 of the spin valve transistor (SVT) type is shown. Although described as incorporating an SVT (where both barrier layers are Schottky barriers), the TTM may alternatively incorporate a magnetic tunnel transistor (MTT) (where one of the barrier layers is a Schottky barrier and the other barrier layer is a tunnel barrier), or a double junction structure (where both barrier layers are tunnel barriers). TTM 400 of FIG. 4 has a base region 15, a collector region 20 which is adjacent base region 15, an emitter region 5, and a barrier region 10 which separates emitter region 5 from base region 15. As described in relation to FIG. 3, collector region 20 may be a semiconductor substrate made of silicon (Si). Base region 15 preferably includes at least one soft ferromagnetic (FM) material, such as nickel-iron (NiFe), cobalt-iron (CoFe), or cobalt (Co), as well as a very thin metal (e.g. gold) which is sandwiched in between the FM materials. Barrier layer 10 is a non-magnetic insulating material, preferably made of aluminum-oxide, which is generally less than 10 Angstroms (Å) in thickness.

As indicated in FIG. 4, a trackwidth $W_T$ of the magnetic head is defined by the dimension of emitter region 5, base region 15, and collector region 20 along the y-axis, while a stripe height $H_S$ of the magnetic head is defined by the dimension of emitter region 5 along the x-axis. A sensing plane 1020 of TTM 400 is defined along sides of base region 15, collector region 20, and emitter region 5. This sensing plane 1020 is at an air bearing surface (ABS) when TTM 400 is embodied in a magnetic head. A non-magnetic insulator layer 1012 is offset behind sensing plane 1020 and adjacent collector region 20 and base region 15. Insulator layer 1012 may be, for example, an oxide materials such as alumina. An emitter lead 35, which may be embodied as a ferromagnetic (FM) shield for TTM 400, is positioned in contact with emitter region 5 at sensing plane 1020. Emitter lead 35 serves as the electrical connection for emitter region 5 to an external lead (not visible in FIG. 4). A base lead 36 is positioned in contact with base region 15 behind sensing plane 1020. Base lead 36 and a collector lead (not visible in FIG. 4) are preferably not formed along sensing plane 1020. Note that additional or alternative leads may be formed in the TTM, which has at least three leads.

The TTM allows hot electrons emitted from emitter region 5 to travel through to base region 15 to reach collector region 20, which collects the magnetocurrent (i.e. collects the electrons). In operation, the device acts as a hot spin electron filter whereby barrier region 10 between emitter region 5 and base region 15 operates to selectively allow the hot electrons to pass on through to base region 15 and then on through collector region 20. When TTM 400 is not functioning, the device is in a known quiescent state. In this case, the magnetization of the free layer which comprises all or part of base region 15 is parallel to the ABS plane. The direction of this magnetization depends on the direction of the magnetic field produced by a pinned layer (not visible) formed adjacent the free layer. The scattering of electrons within the free layer is dependent upon the orientation of the magnetization within the free layer. For example, if the magnetization is pointing in the parallel direction relative to the pinned layer (i.e. parallel to the ABS plane), then the electrons are not scattered as much as compared to the case where the free layer is antiparallel relative to the pinned layer. The performance of the device may be different depending upon the relative configuration of emitter region 5, the free layer, and the hard bias layer.

Since it is advantageous to form a very thin base region 15 (e.g. between about 20-200 Å) for increased areal recording densities, base region 15 will have a relatively large electrical resistance if nothing is done to reduce it. With the trackwidth (TW) of the magnetic head being defined at between about 10 and 100 nanometers (nm) (e.g. approximately 50 nm), the electrical resistance of base region 15 may be much greater than 100 Ω. Thus, as the sense current passes through base region 15 from emitter lead 35 to base lead 36, base region 15 may be vulnerable to damage or failure (e.g. it could "blow" like a fuse). A relatively large resistance of base region 15 also raises the noise floor for the TTM 400 such that a much larger input signal for TTM 400 would be required for suitable operation.

Accordingly, a metal layer 1050 is formed in TTM 400 so as to be offset from sensing plane 1020 and in-plane and in contact with magnetic materials of base region 15. In FIG. 4, metal layer 1050 is formed in contact with insulator layer 1012 but not in contact with base lead 36. This metal layer 1050 is thicker than any other metal film which may be formed within base region 15 itself; metal layer 1050 is preferably formed to a thickness of between 50-500% (at least 50%) of the total thickness of base region 15. For example, metal layer 1050 may be formed to a thickness of between about 100-1000 Å. Note that metal layer 1050 stops where insulator layer 1012 ends; it does not extend over collector region 20. if a metal were formed over a collector via 22 where collector region 20 meets base region 15, it would cause a short between the two leads. As an alternative to or in combination with metal layer 1050, TTM 400 of FIG. 4 also shows that a metal layer 1050 may be formed adjacent and between (in contact with) insulator layer 1012 and base lead 36. In addition, an alternative TTM 500 of FIG. 5 shows that metal layer 1050 may be alternatively formed along a top surface of base region 15 and in contact with base lead, not formed in contact with insulator layer 1012, and otherwise being the same as that shown and described in relation to FIG. 4.

Figure 5:
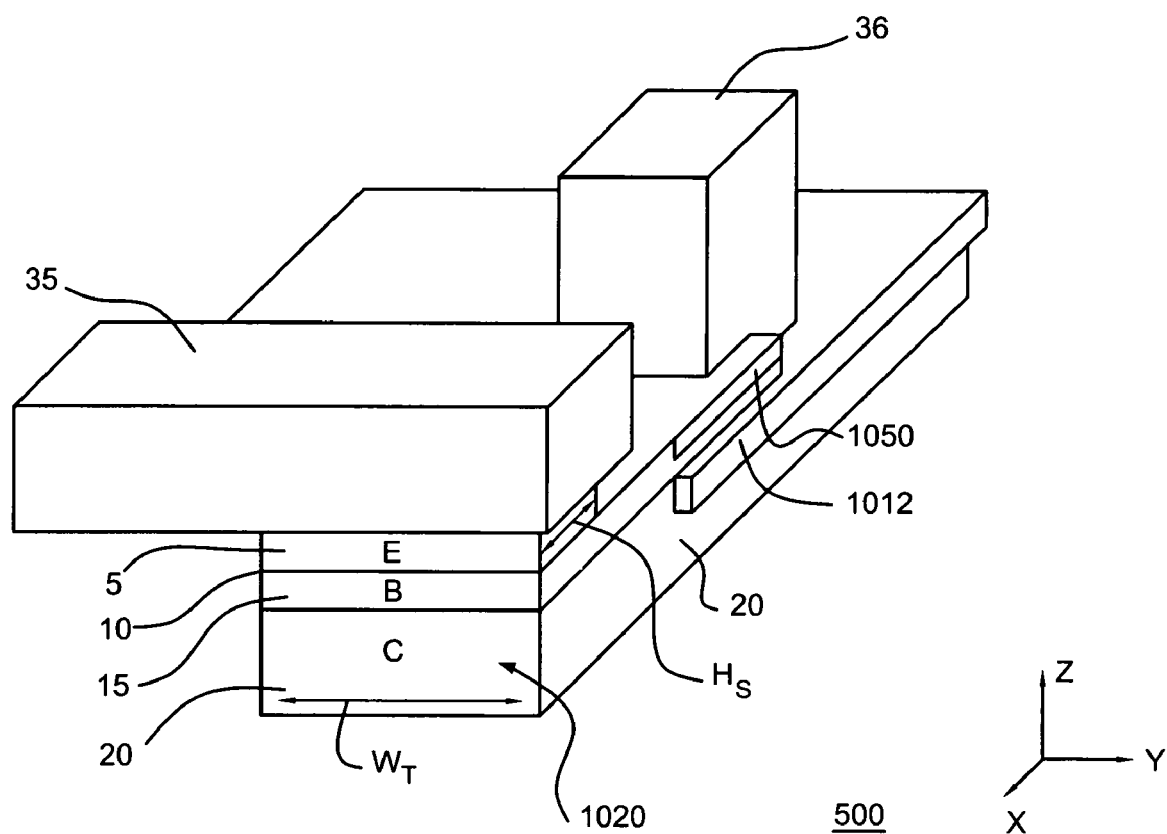
FIG. 5 is a perspective view of another TTM having an alternative metal layer formed so as to reduce the base resistance.

Such metal layers of FIGS. 4 and 5 reduce the electrical resistance of base region 15, which is advantageous as it serves to reduce signal noise in TTM 400 by lowering the noise floor. Preferably, metal layer 1050 has an electrical resistivity of less than 10 Ω-centimeter (cm). For example, metal layer 1050 may be made of copper (Cu), gold (Au), ruthenium (Ru), alloys and/or combinations thereof. Copper has an approximate electrical resistivity of 2 μΩ-cm, gold has an approximate electrical resistivity of 5 μΩ-cm, and ruthenium has an approximate electrical resistivity of 7 μΩ-cm. In comparison, base region 15 alone with magnetic materials (e.g. ferromagnetic (FM) materials such as nickel-iron (NiFe) and cobalt-iron (CoFe) may have an electrical resistivity of between about 18-40 μΩ-cm. On the other hand, the electrical resistivity of combined materials for base region 15 and metal layer 1050 may be between about 2-18 μΩ-cm. As a result, the combined layer may have a combined electrical resistance of between about 5-100Ω.

Figure 6:
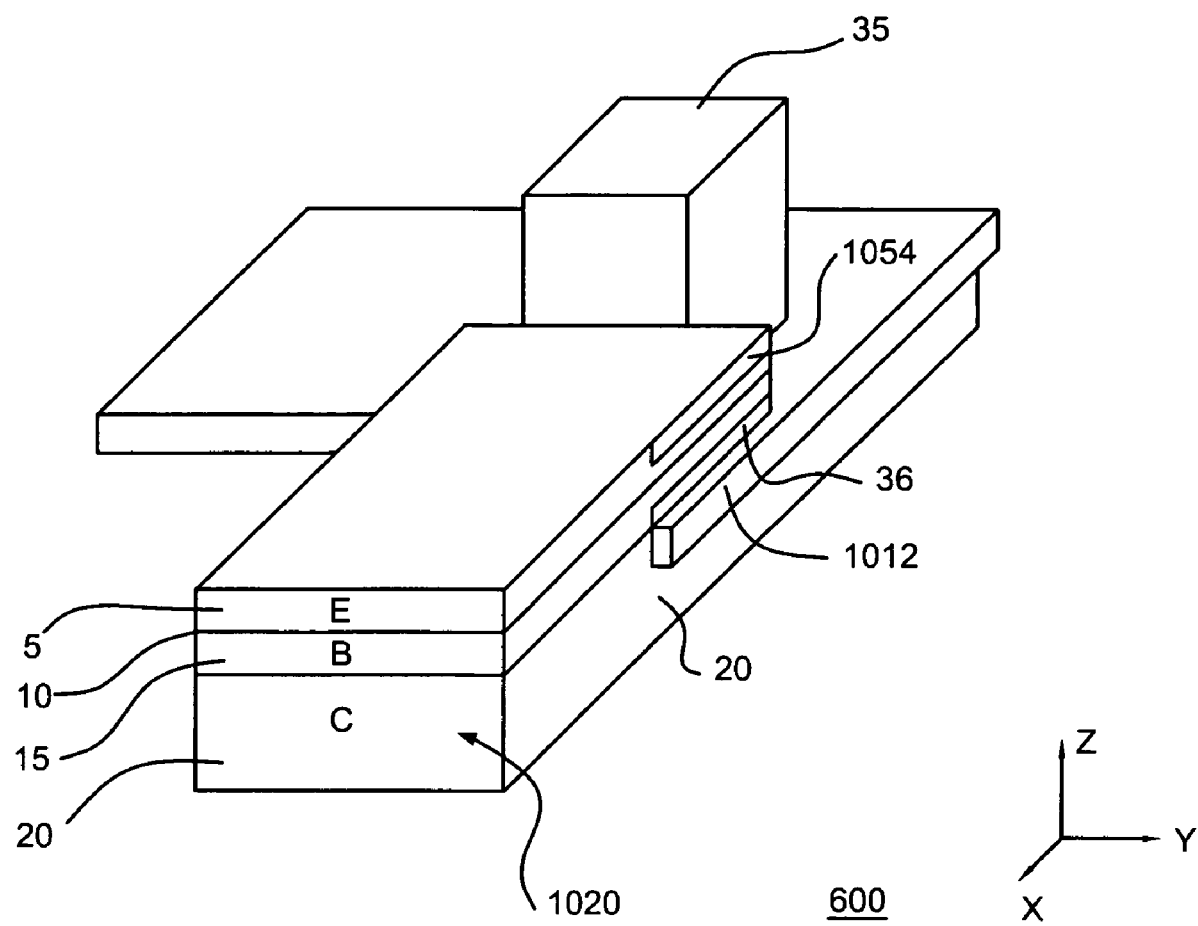
FIG. 6 is a perspective view of yet another TTM having an alternative metal layer formed so as to reduce the emitter resistance.

As an alternative to or in combination with the metal layers of FIGS. 4 or 5, a TTM 600 of FIG. 6 shows that a metal layer 1054 may be formed in plane and in contact with magnetic materials of emitter region 5. This TTM 600 of FIG. 6 has a different construction than that shown and described in relation to FIGS. 4 and 5. Comparing the embodiment of FIG. 6 with that of FIG. 4, emitter region 5 extends much further behind sensing plane 1020. Emitter lead 35 of FIG. 6 is located where the previous base lead in FIG. 4 was formed and base lead 36 of FIG. 6 is located where the previous metal layer in FIG. 4 was formed. Again, this metal layer 1054 is formed in plane and in contact with magnetic materials of emitter region 5. Metal layer 1054 is also formed in contact with emitter lead 35. This metal layer 1054 is offset from sensing plane 1020 and does not make contact with collector region 20. Otherwise metal layer 1054 of FIG. 6 may be the same or similar to that described in relation to FIG. 4, where it reduces the electrical resistance of emitter region 5 with the same or similar results.

Figure 7A:
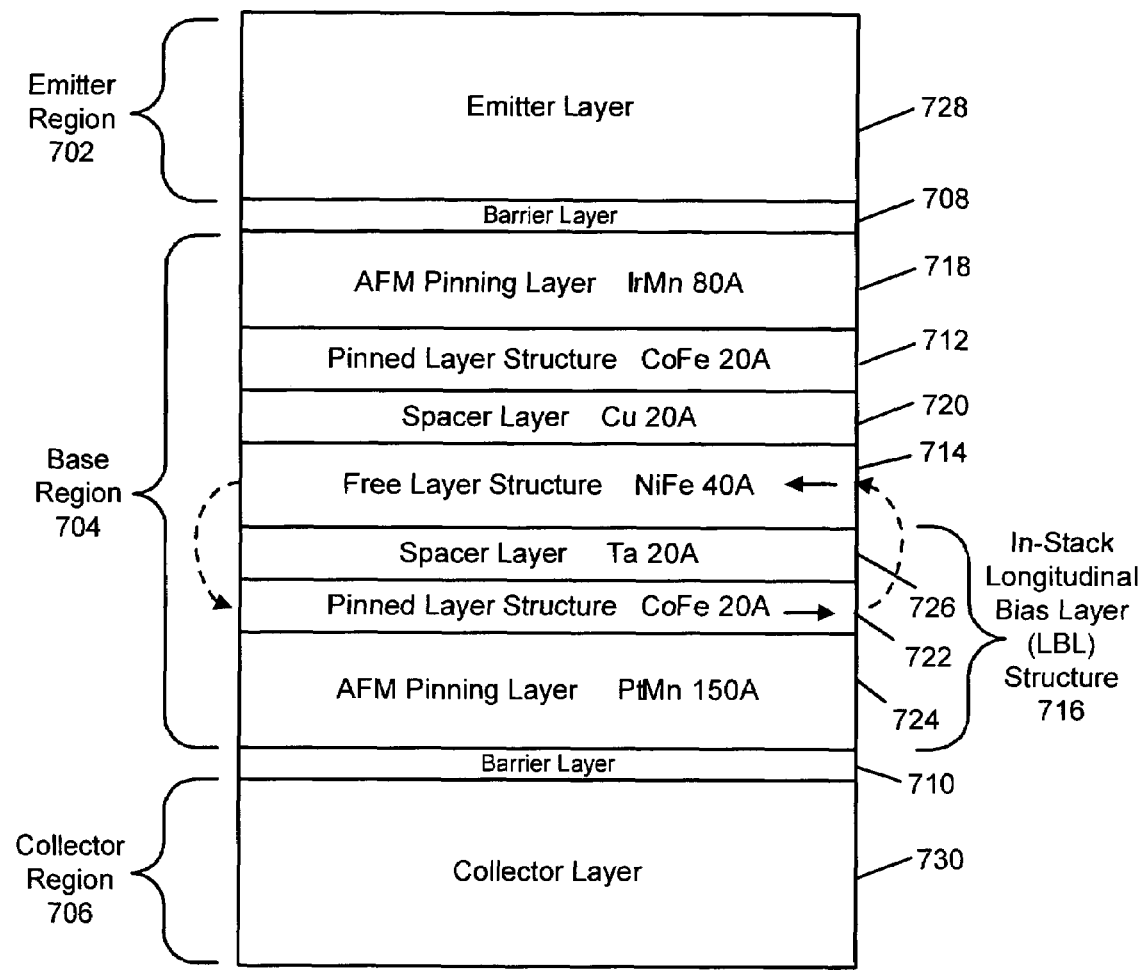
FIG. 7A is a sensor plane (or ABS) view of one embodiment of a TTM which includes a base region having a free layer structure, a pinned layer structure, and an in-stack longitudinal biasing layer (LBL) structure which magnetically biases the free layer structure.

FIG. 7A is a sensing plane (or ABS) view of one embodiment of a three terminal magnetic sensor (TTM) 700a of the present application. TTM 700a of FIG. 7A has the general structure and functionality as described above in relation to the drawings, with or without having the metal layer for reduced lead resistance. As shown in FIG. 7A, TTM 700a has an emitter region 702, a base region 704, and a collector region 706. A first barrier layer 708 is located between emitter region 702 and base region 704, and a second barrier layer 710 is located between collector region 706 and base region 704. First barrier layer 708 may be a Schottky barrier (electrically conductive material) or a tunnel barrier (insulator material). Similarly, second barrier layer 726 may be a Schottky barrier (electrically conductive material) or a tunnel barrier (insulator material). Emitter region 702 has one or more emitter layers 728 which may be or include a silicon layer or a ferromagnetic (FM) layer such as nickel-iron. Collector region 706 has one or more collector layers 730 which may be or include a silicon layer or an FM layer such as nickel-iron.

In this embodiment, base region 704 includes a free layer structure 714, a pinned layer structure 712, an antiferromagnetic (AFM) pinning layer 718, a first non-magnetic spacer layer 720, an in-stack longitudinal biasing layer (LBL) structure 716, and a second non-magnetic spacer layer 726. Pinned layer structure 712 is adjacent first non-magnetic spacer layer 720, which is in turn adjacent free layer structure 714. An FM pinned layer of pinned layer structure 712 is magnetically pinned by exchange-coupling with AFM pinning layer 718. AFM pinning layer 718 is located between and adjacent pinned layer structure 712 and first barrier layer 708. The pinning field generated by AFM pinning layer 718 should be greater than demagnetizing fields to ensure that the magnetization direction of the FM pinned layer remains fixed during application of external fields (e.g. fields from bits recorded on the disk). The magnetization of free layer structure 714 is not fixed and is free to rotate in response to the field from the information recorded on the magnetic medium (i.e. the signal field).

Figure 11:
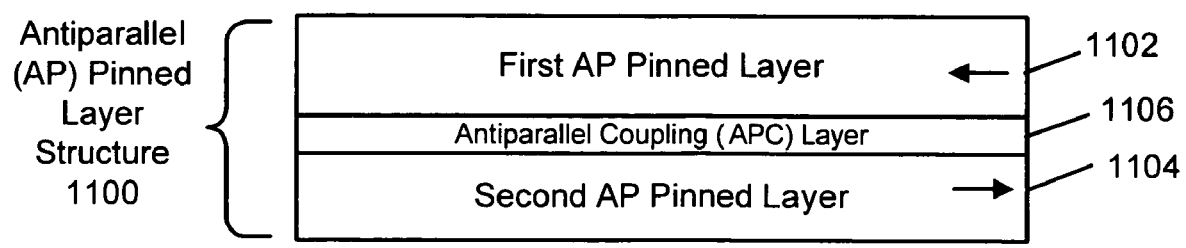
FIG. 11 is a sensor plane (or ABS) view of an antiparallel (AP) pinned layer structure for use in the TTMs of FIGS. 7-10.

Pinned layer structure 712 may be a single FM layer or, alternatively, a multi-layer structure. In particular, pinned layer structure 712 may be an antiparallel (AP) pinned layer structure as shown in FIG. 11. In FIG. 11, an AP pinned layer structure 1100 includes a first AP pinned layer 1102, a second AP pinned layer 1104, and an AP coupling layer 1106 formed between first and second AP pinned layers 1102 and 1104. First AP pinned layer 1102, for example, may be the layer that is exchange-coupled to and pinned by the AFM pinning layer 718. By strong antiparallel coupling between the first and second AP pinned layers 1102 and 1104, the magnetic moment of second AP pinned layer 1104 is made antiparallel to the magnetic moment of first AP pinned layer 1102.

In-stack LBL structure 716 is located adjacent and between free layer structure 714 and second barrier layer 710. Being formed "in-stack" with the sensor layers, LBL structure 716 is formed within the central region of the sensor but not within side regions thereof. LBL structure 716 includes a pinned layer structure 722, an AFM pinning layer 724, and a non-magnetic spacer layer 726. AFM pinning layer 724 of LBL structure 716 is located between and adjacent pinned layer structure 722 and second barrier layer 710. FM pinned layer 712 is magnetically pinned by exchange-coupling with an AFM pinning layer 718. In particular, AFM pinning layer 724 pins a magnetic moment of pinned layer structure 722 parallel to the ABS and parallel to the planes of the sensor layers as indicated. Spacer layer 726 causes pinned layer structure 722 and free layer structure 714 to be physically separated but in close proximity to each other. Because of pinned layer structure 722, the magnetic moment of free layer structure 714 is magnetically stabilized parallel to the ABS and parallel to the major planes of the sensor as indicated by the dashed arrows. This biasing is uniform from the sides of free layer structure 714 so that the biasing does not cause a limitation on narrow track width sensors. Pinned layer structure 722 may be a single FM layer or alternatively a multi-layer structure, and may include an AP pinned structure as previously shown and described in relation to FIG. 11. Spacer layer 726 may be chosen to provide either weakly ferromagnetic coupling or AP-coupling between pinned layer structure 722 and free layer structure 714.

Note that AFM pinning layer 724 of LBL structure 716 should preferably magnetically pin at a different temperature than AFM pinning layer 718. The reason is so that, during TTM fabrication, the pinning achieved for AFM pinning layer 724 will not be adversely affected by the subsequent pinning process utilized for AFM pinning layer 718. As is known, the pinning of AFM pinning layers is typically achieved by heating the AFM materials to a predetermined temperature and applying a magnetic field at the same time. Preferably, to obtain the difference in pinning temperatures, AFM pinning layer 724 is made of a different material than that of AFM pinning layer 718. For example, AFM pinning layer 718 may be made of platinum-manganese (PtMn) and AFM pinning layer 724 may be made of iridium-manganese (IrMn). A similar result may be achieved by utilizing the same materials for AFM pinning layers 718 and 724 with different thicknesses. More generally, the choice of any AFM material and its thickness may vary. The AFM layers may be the same material or alternatively have the same thickness. Preferably, the AFM layers are made of different materials and have different thicknesses.

Exemplary thicknesses and materials of TTM 700a are indicated in FIG. 7A. In-stack longitudinal bias layer structure 716 has AFM pinning layer 724 made of platinum-manganese (PtMn) with a thickness of about 150 Angstroms, pinned layer 724 made of cobalt-iron (CoFe) with a thickness of about 20 Angstroms, and spacer layer 726 made of tantalum (Ta) with a thickness of about 20 Angstroms. AFM pinning layer 718 is made of iridium-manganese (IrMn) with a thickness of about 80 Angstroms, pinned layer 712 made of cobalt-iron (CoFe) with a thickness of about 20 Angstroms, and spacer layer 720 made of copper (Cu) with a thickness of about 20 Angstroms. Free layer structure 714 is made of nickel-iron (NiFe) with a thickness of about 40 Angstroms.

Preferably, there is a predetermined relationship established between the magnetic thickness of the pinned layer structure 722 of LBL structure 716 and the magnetic thickness of free layer structure 714. Preferably, the magnetic thickness of pinned layer structure 722 is made to be substantially the same as the magnetic thickness of free layer structure 714. However, the magnetic thickness of the pin layer may be between 50-500% of the thickness of the free layer.

Figure 7B:
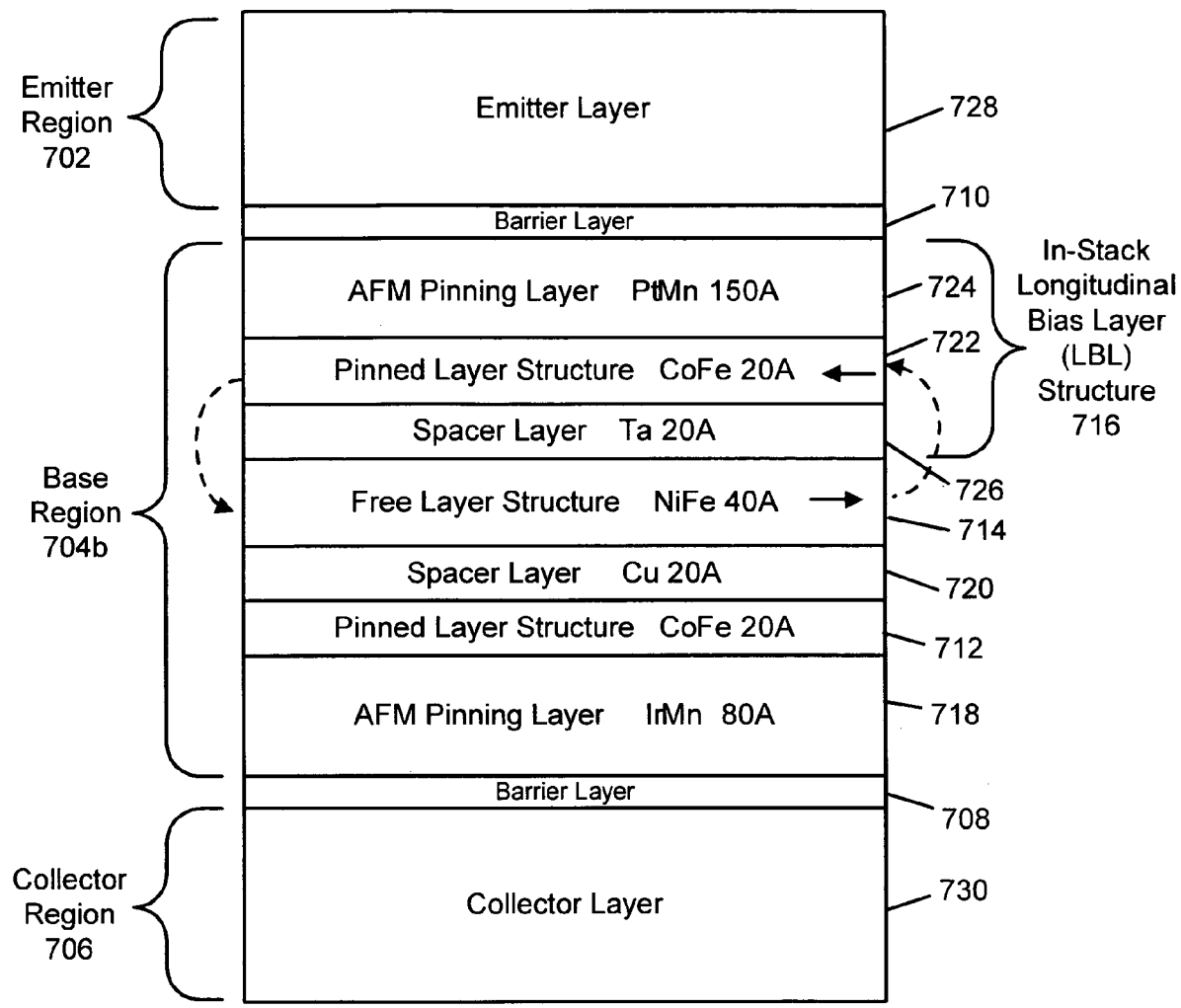
FIG. 7B is a sensor plane (or ABS) view of one variation of the embodiment of FIG. 7A where the layers in the base region are inverted.
Figure 7C:
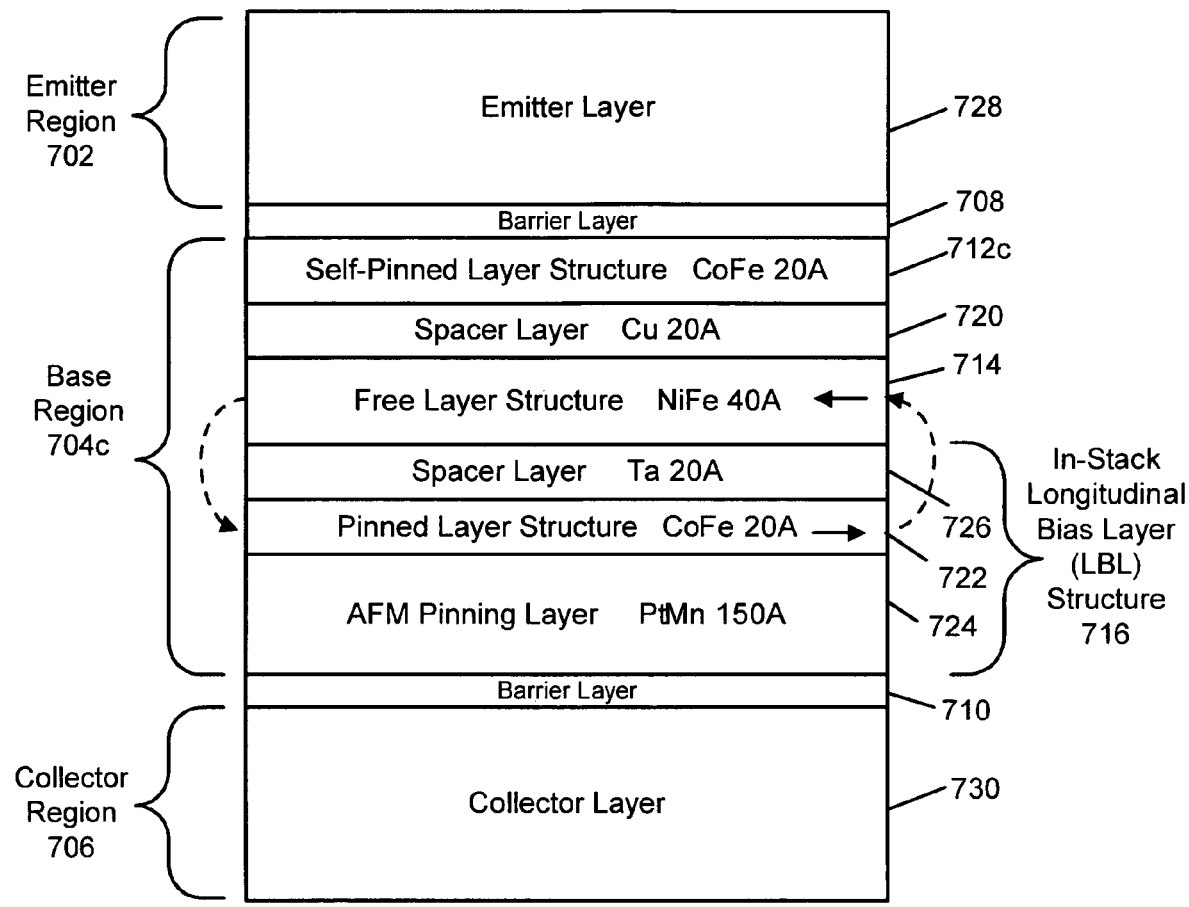
FIG. 7C is a sensor plane (or ABS) view of another variation of the embodiment of FIG. 7A, where the base region has the free layer structure, the in-stack longitudinal biasing layer (LBL) structure, and a self-pinned layer structure.
Figure 7D:
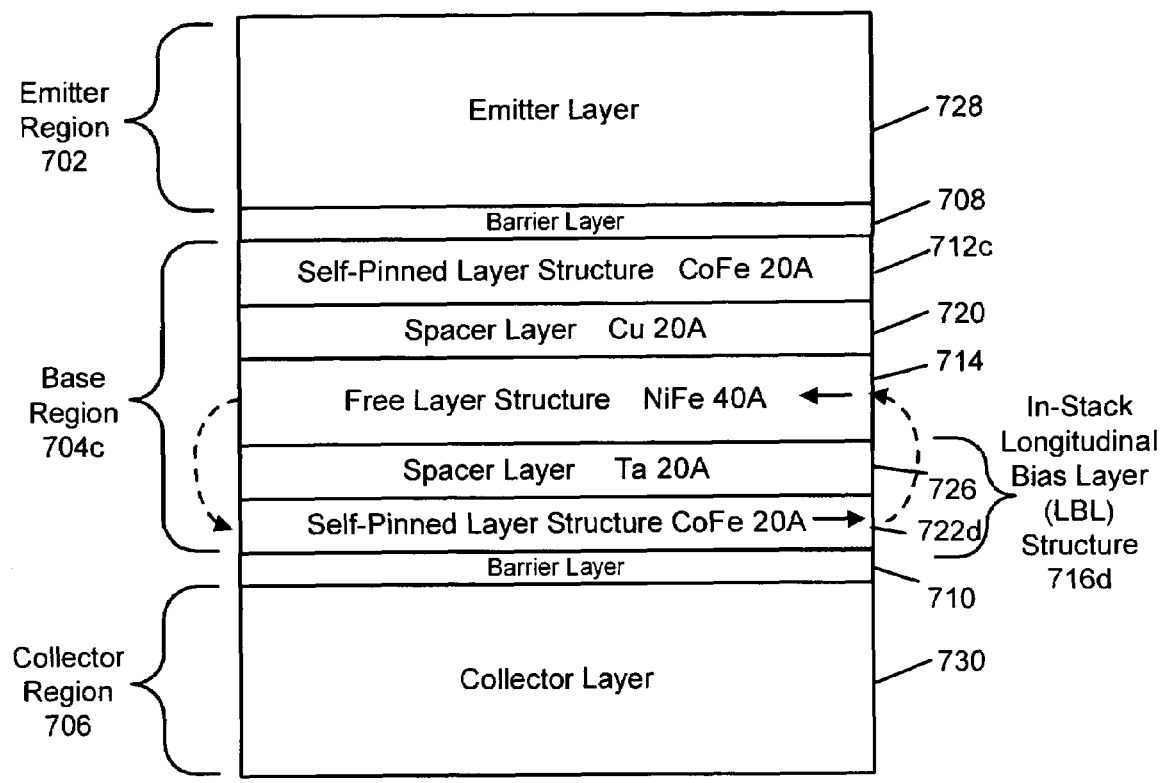
FIG. 7D is a sensor plane (or ABS) view of a variation of the embodiment of FIG. 7C, where the base region has the free layer structure, the self-pinned layer structure, and the in-stack longitudinal biasing layer (LBL) structure which also has a self-pinned layer structure.

One variation of the TTM 700a of FIG. 7A is a TTM 700b shown in FIG. 7B. TTM 700b of FIG. 7B is the same as TTM 700a of FIG. 7A except that the layers in base region 704 are inverted as shown. Another variation of the TTM 700a of FIG. 7A is a TTM 700c shown in FIG. 7C. TTM 700c of FIG. 7C is the same as TTM 700a of FIG. 7A except that base region 704c includes a self-pinned layer structure 712c as the pinned layer structure. For TTM 700c, the AFM pinning layer 718 of the TTM 700a of FIG. 7A is not needed for pinning purposes. A sensor of the self-pinned type relies on magnetostriction of the self-pinned structure and the ABS stress for a self-pinning effect. The AFM pinning layer, which is typically as thick as 150 Angstroms, is no longer necessary for pinning purposes so that a thinner sensor can be made. TTM 700d of FIG. 7D is another structural variation where LBL structure 716d also has a self-pinned layer structure 722d. Note that the self-pinned layer structure 722d of FIG. 7D may include one or multiple layers of materials. In this variation, structure 712c may or may not be self-pinned.

Figure 8A:
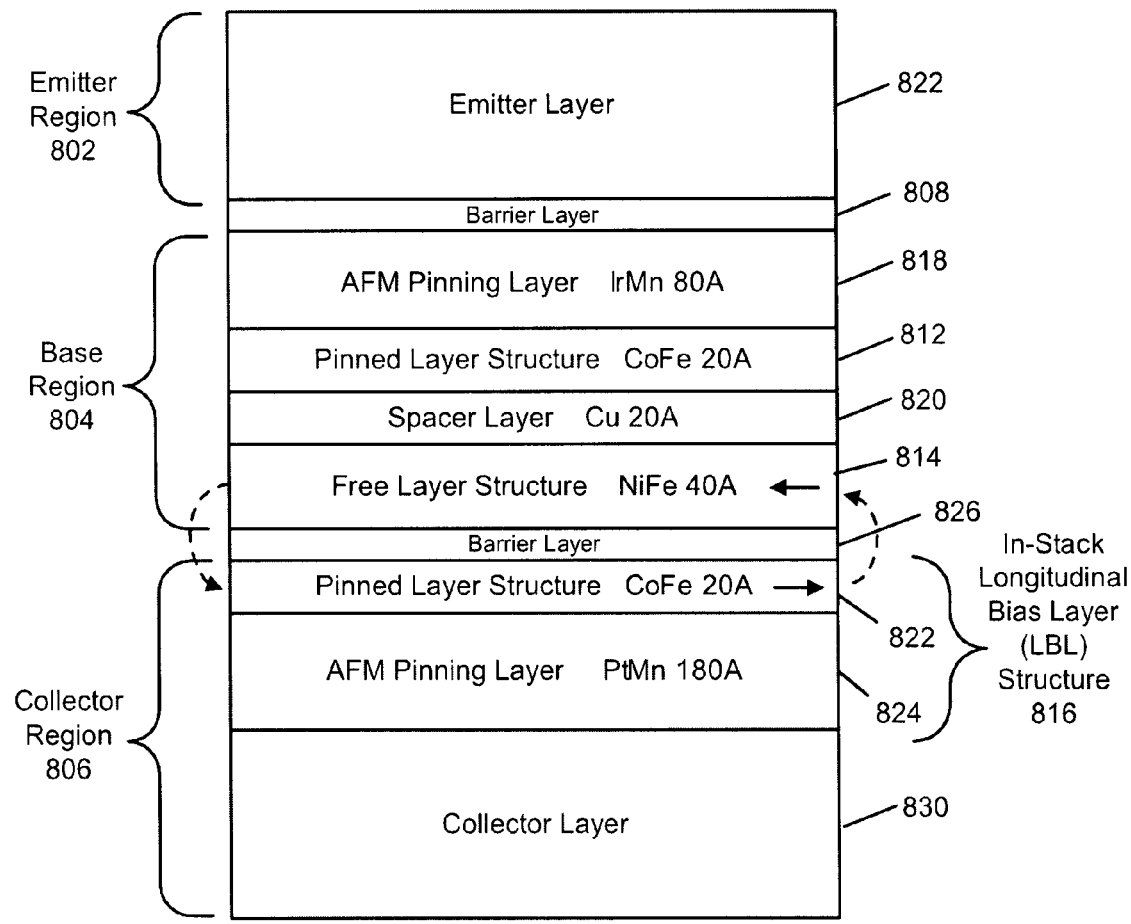
FIG. 8A is a sensor plane (or ABS) view of another embodiment of a TTM, the TTM including a base region having a free layer structure and a pinned layer structure, and a collector region having an in-stack LBL structure which magnetically biases the free layer structure.

FIG. 8A is a sensing plane (or ABS) view of another embodiment of a TTM 800a of the present application. TTM 800a of FIG. 8A has the general structure and functionality of the TTM shown and described above in relation to the drawings, with or without having the metal layer for reduced lead resistance. As shown in FIG. 8A, TTM 800a has an emitter region 802, a base region 804, and a collector region 806. A first barrier layer 808 is located between emitter region 802 and base region 804, and a second barrier layer 826 is located between collector region 806 and base region 804. First barrier layer 808 may be a Schottky barrier (electrically conductive material) or a tunnel barrier (insulator material). Similarly, second barrier layer 826 may be a Schottky barrier (electrically conductive material) or a tunnel barrier (insulator material). Emitter region 802 has one or more emitter layers 828 which may be or include a silicon layer or an FM layer such as nickel-iron.

In this embodiment, base region 804 includes a free layer structure 814, a pinned layer structure 812, an AFM pinning layer 818, and a non-magnetic spacer layer 820. Pinned layer structure 812 is adjacent first non-magnetic spacer layer 820, which is in turn adjacent free layer structure 814. An FM pinned layer of pinned layer structure 812 is magnetically pinned by exchange-coupling with AFM pinning layer 818. AFM pinning layer 818 is located between and adjacent pinned layer structure 812 and first barrier layer 808. The pinning field generated by AFM pinning layer 818 should be greater than demagnetizing fields to ensure that the magnetization direction of the FM pinned layer remains fixed during application of external fields (e.g. fields from bits recorded on the disk). The magnetization of free layer structure 814 is not fixed and is free to rotate in response to the field from the information recorded on the magnetic medium (i.e. the signal field). Pinned layer structure 812 may be a single FM layer or, alternatively, a multi-layer structure. In particular, pinned layer structure 812 may be an AP pinned layer structure as shown and described earlier in relation to FIG. 11.

Collector region 806 has an in-stack LBL structure 816. Collector region 806 may also have one or more other collector layers 830 which may be or include a silicon layer or an FM layer such as nickel-iron. Being formed "in-stack" with the sensor layers, LBL structure 816 of collector region 806 is formed within the central region of the sensor but not within side regions thereof. LBL structure 816 includes a pinned layer structure 828 and an AFM pinning layer 824. Second barrier layer 826 is formed between LBL structure 816 and free layer structure 814, causing pinned layer structure 822 and free layer structure 814 to be physically separated but in close proximity to each other. As apparent, second barrier layer 826 simultaneously serves as a spacer layer for LBL structure 816; no separate spacer layer is needed. Note that since base region 806 does not contain LBL structure 816, base region 806 has a smaller thickness for an improved signal in the TTM 800.

Pinned layer structure 822 of LBL structure 816 is magnetically pinned by exchange-coupling with AFM pinning layer 824. In particular, AFM pinning layer 824 pins a magnetic moment of pinned layer structure 822 parallel to the ABS and parallel to the planes of the sensor layers as indicated. Because of pinned layer structure 822, the magnetic moment of free layer structure 814 is magnetically stabilized parallel to the ABS and parallel to the major planes of the sensor as indicated by the dashed arrows. This biasing is uniform from the sides of free layer structure 814 so that the biasing does not cause a limitation on narrow track width sensors. Pinned layer structure 822 may be a single FM layer or alternatively a multi-layer structure, and may include an AP pinned structure as previously shown and described in relation to FIG. 11.

Note that AFM pinning layer 824 of LBL structure 816 should preferably magnetically pin at a different temperature than AFM pinning layer 818. The reason is so that, during TTM fabrication, the pinning achieved for AFM pinning layer 824 will not be adversely affected by the subsequent pinning process utilized for AFM pinning layer 818. As is known, the pinning of AFM pinning layers is typically achieved by heating the AFM materials to a predetermined temperature and applying a magnetic field at the same time. Preferably, to obtain the difference in pinning temperatures, AFM pinning layer 824 is made of a different material than that of AFM pinning layer 818. For example, AFM pinning layer 818 may be made of platinum-manganese (PtMn) and AFM pinning layer 824 may be made of iridium-manganese (IrMn). A similar result may be achieved by utilizing the same materials for AFM pinning layers 818 and 824 with different thicknesses. More generally, the choice of any AFM material and its thickness may vary. The AFM layers may be the same material or alternatively have the same thickness. Preferably, the AFM layers are made of different materials and have different thicknesses.

Exemplary thicknesses and materials of TTM 800a are indicated in FIG. 8A. In-stack longitudinal bias layer structure 816 has AFM pinning layer 824 made of platinum-manganese (PtMn) with a thickness of about 180 Angstroms and pinned layer 822 made of cobalt-iron (CoFe) with a thickness of about 20 Angstroms. AFM pinning layer 818 is made of iridium-manganese (IrMn) with a thickness of about 80 Angstroms, pinned layer 812 made of cobalt-iron (CoFe) with a thickness of about 20 Angstroms, and spacer layer 820 made of copper (Cu) with a thickness of about 20 Angstroms. Free layer structure 814 is made of nickel-iron (NiFe) with a thickness of about 40 Angstroms.

Preferably, there is a predetermined relationship established between the magnetic thickness of the pinned layer structure 822 of LBL structure 816 and the magnetic thickness of free layer structure 814. In particular, the magnetic thickness of pinned layer structure 822 is made to be substantially the same as the magnetic thickness of free layer structure 814. However, the magnetic thickness of the pinned layer may be between 50-500% of the thickness of the free layer.

Figure 8B:
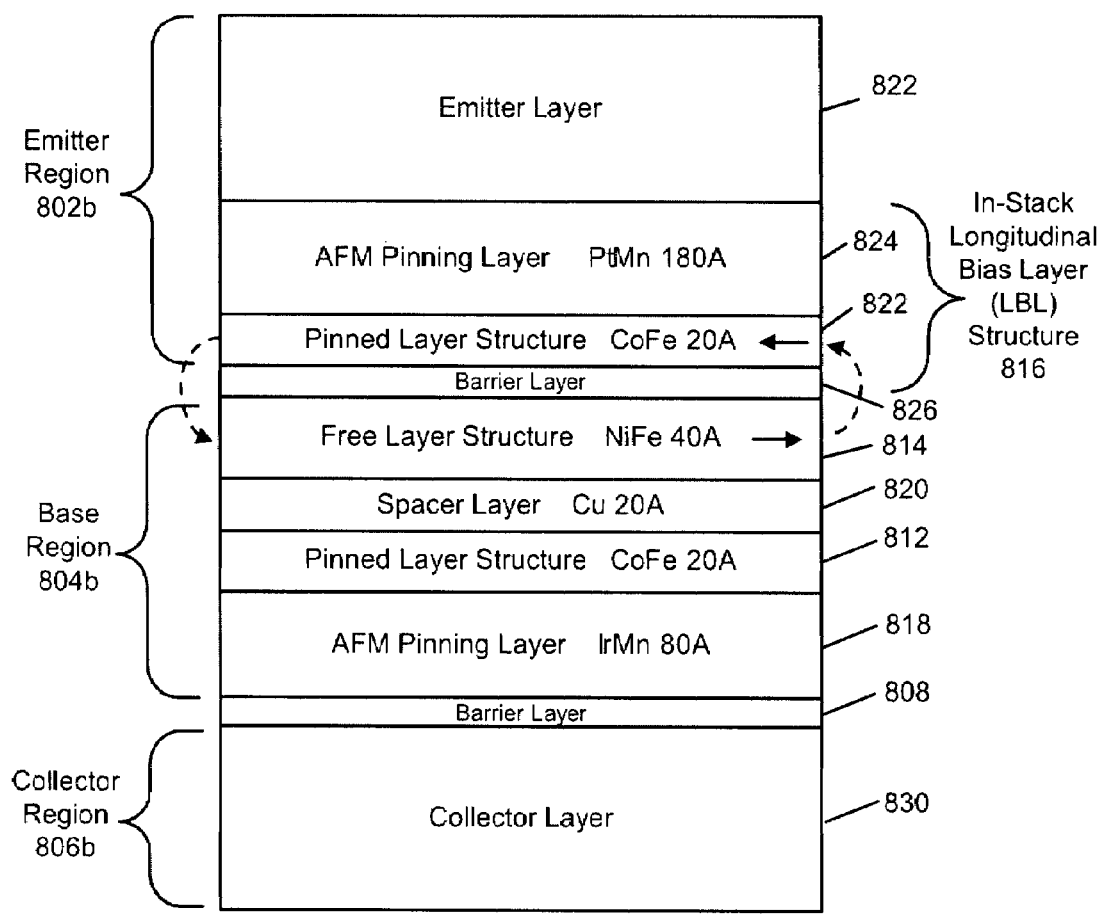
FIG. 8B is a sensor plane (or ABS) view of one variation of the embodiment of FIG. 8A, where the layers of the base region and the in-stack LBL structure are inverted such that the base region has the free layer structure and the pinned layer structure and the emitter region has the in-stack LBL structure.
Figure 8C:
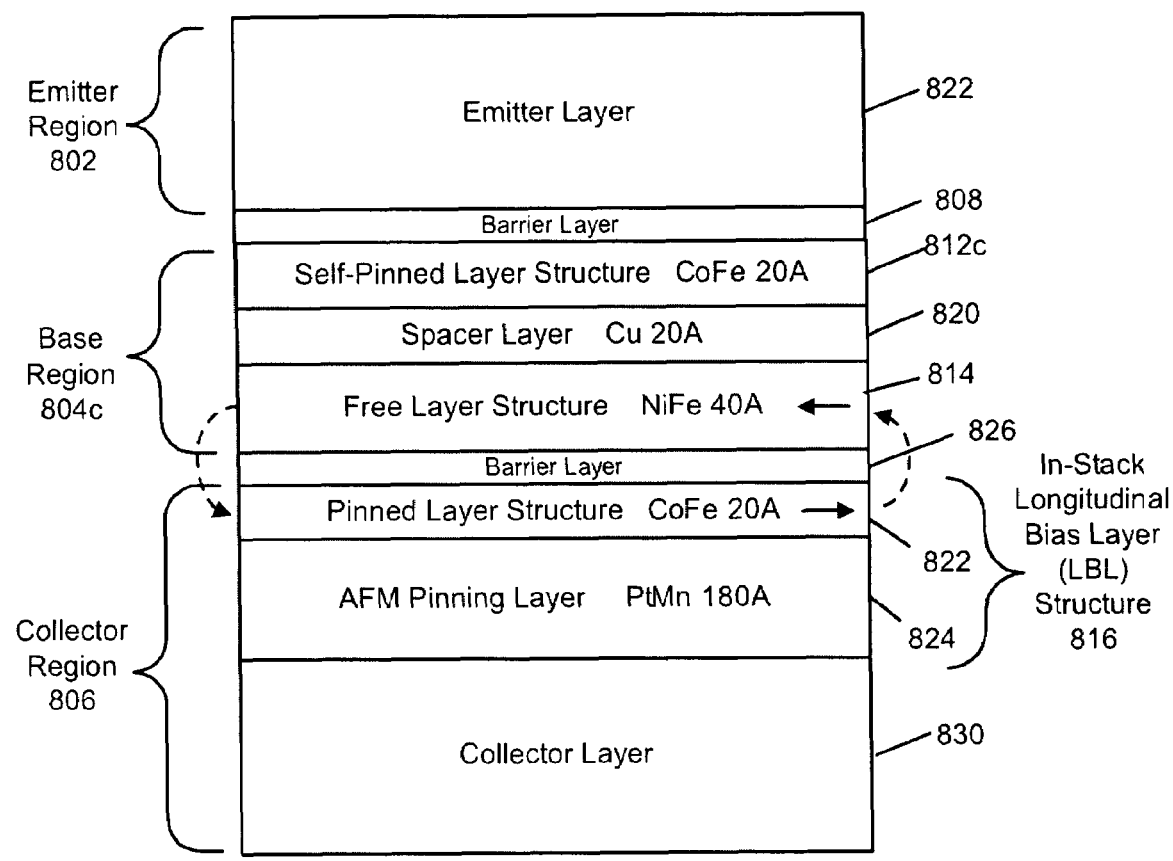
FIG. 8C is a sensor plane (or ABS) view of another variation of the embodiment of FIG. 8A, where the base region has the free layer structure and a self-pinned layer structure and the collector region has the in-stack LBL structure.
Figure 8D:
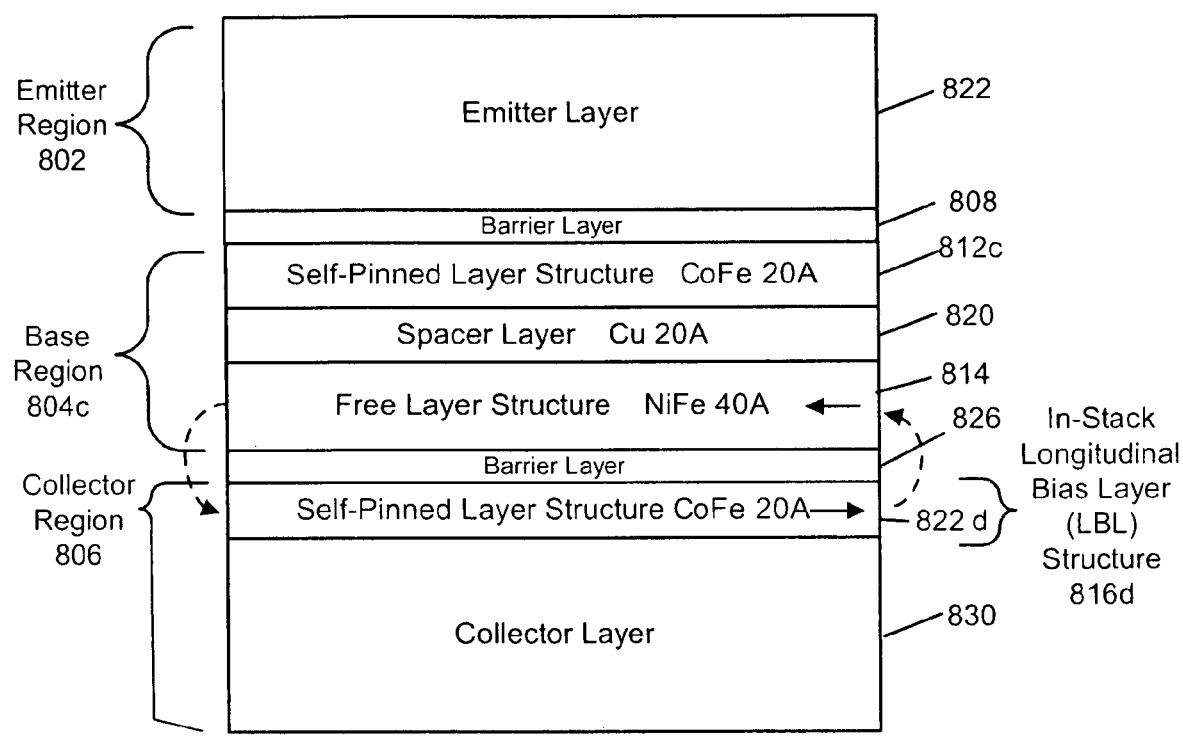
FIG. 8D is a sensor plane (or ABS) view of a variation of the embodiment of FIG. 8C, where the base region has the free layer structure and the self-pinned layer structure and the collector region has the in-stack LBL structure which also includes a self-pinned layer structure.

One variation of the TTM 800a of FIG. 8A is a TTM 800b shown in FIG. 8B. TTM 800b of FIG. 8B is the same as TTM 800a of FIG. 8A except that the layers are inverted as shown, such that an emitter region 802b includes in-stack LBL structure 816 and base region 804b includes free layer structure 814 and pinned layer structure 812. Another variation of the TTM 800a of FIG. 8A is a TTM 800c shown in FIG. 8C. TTM 800c of FIG. 8C is the same as TTM 800a of FIG. 8A except that a base region 804c includes a self-pinned layer structure 812c as the pinned layer structure. For TTM 800c, the AFM pinning layer 818 of the TTM 800a of FIG. 8A is not needed for pinning purposes. A sensor of the self-pinned type relies on magnetostriction of the self-pinned structure and the ABS stress for a self-pinning effect. The AFM pinning layer, which is typically as thick as 150 Angstroms, is no longer necessary for pinning purposes so that a thinner sensor can be made. TTM 800d of FIG. 8D is another structural variation where LBL structure 816d also has a self-pinned layer structure 822d. Note that the self-pinned layer structure 822d of FIG. 8D may include one or multiple layers of materials. In this variation, structure 812c may or may not be self-pinned.

Figure 9A:
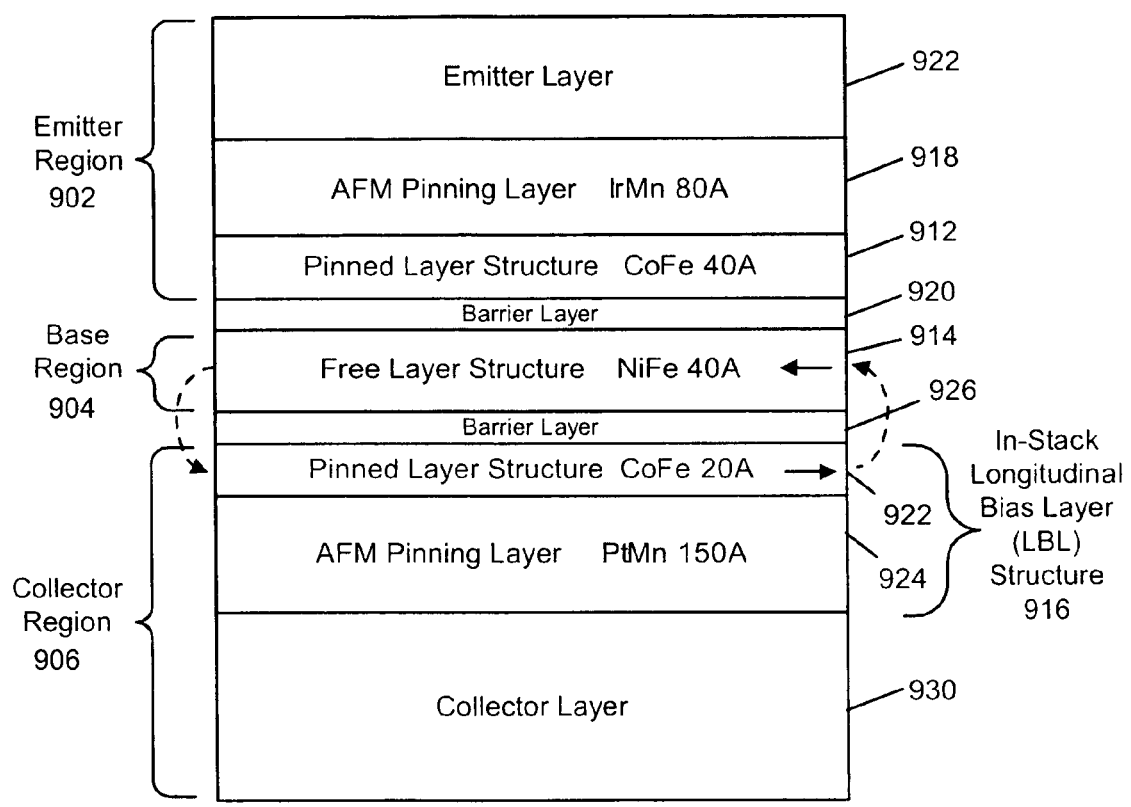
FIG. 9A is a sensor plane (or ABS) view of yet another embodiment of a TTM, the TTM including a base region having a free layer structure, an emitter region having a pinned layer structure, and a collector region having an in-stack LBL structure which magnetically biases the free layer structure.

FIG. 9A is a sensing plane (or ABS) view of yet another embodiment of a TTM 900a of the present application. TTM 900a of FIG. 9A has the general structure and functionality of the TTM shown and described above in relation to the drawings, with or without having the metal layer for reduced lead resistance. As shown in FIG. 9A, TTM 900a has an emitter region 902, a base region 904, and a collector region 906. A first barrier layer 920 is located between emitter region 902 and base region 904, and a second barrier layer 926 is located between collector region 906 and base region 904. First barrier layer 920 may be a Schottky barrier (electrically conductive material) or a tunnel barrier (insulator material). Similarly, second barrier layer 926 may be a Schottky barrier (electrically conductive material) or a tunnel barrier (insulator material).

In this embodiment, base region 904 consists of a free layer structure 914. Since free layer structure 914 is the only structure provided within base region 904, the base region has a relatively small thickness for an improved signal in the TTM 900. Emitter region 902 has a pinned layer structure 912 and an AFM pinning layer 918. Emitter region 902 may also have one or more other emitter layers 928 which may be or include a silicon layer or an FM layer such as nickel-iron. Pinned layer structure 912 is adjacent first barrier layer 920, which is in turn adjacent free layer structure 914. As apparent, first barrier layer 920 simultaneously serves as a spacer layer between pinned layer structure 912 and free layer structure 914.

An FM pinned layer of pinned layer structure 912 is magnetically pinned by exchange-coupling with AFM pinning layer 918, which is formed adjacent pinned layer structure 912. The pinning field generated by AFM pinning layer 918 should be greater than demagnetizing fields to ensure that the magnetization direction of the FM pinned layer remains fixed during application of external fields (e.g. fields from bits recorded on the disk). The magnetization of free layer structure 914 is not fixed and is free to rotate in response to the field from the information recorded on the magnetic medium (i.e. the signal field). Pinned layer structure 912 may be a single FM layer or, alternatively, a multi-layer structure. In particular, pinned layer structure 912 may be an AP pinned layer structure as shown and described earlier in relation to FIG. 11.

Collector region 906 has an in-stack LBL structure 916. Collector region 906 may also have one or more other collector layers 930 which may be or include a silicon layer or an FM layer such as nickel-iron. Being formed "in-stack" with the sensor layers, LBL structure 916 of collector region 906 is formed within the central region of the sensor but not within side regions thereof. LBL structure 916 includes a pinned layer structure 922 and an AFM pinning layer 924. Second barrier layer 926 is formed between LBL structure 916 and free layer structure 914, causing pinned layer structure 922 and free layer structure 914 to be physically separated but in close proximity to each other. As apparent, second barrier layer 926 simultaneously serves as a spacer layer for LBL structure 916; no separate spacer layer is needed to provide such separation.

Pinned layer structure 922 is magnetically pinned by exchange-coupling with AFM pinning layer 924. In particular, AFM pinning layer 924 pins a magnetic moment of pinned layer structure 922 parallel to the ABS and parallel to the planes of the sensor layers as indicated. Because of pinned layer structure 922, the magnetic moment of free layer structure 914 is magnetically stabilized parallel to the ABS and parallel to the major planes of the sensor as indicated by the dashed arrows. This biasing is uniform from the sides of free layer structure 914 so that the biasing does not cause a limitation on narrow track width sensors. Pinned layer structure 922 may be a single FM layer or alternatively a multi-layer structure, and may include an AP pinned structure as previously shown and described in relation to FIG. 11.

Note that AFM pinning layer 924 of LBL structure 916 should preferably magnetically pin at a different temperature than AFM pinning layer 918. The reason is so that, during TTM fabrication, the pinning achieved for AFM pinning layer 924 will not be adversely affected by the subsequent pinning process utilized for AFM pinning layer 918. As is known, the pinning of AFM pinning layers is typically achieved by heating the AFM materials to a predetermined temperature and applying a magnetic field at the same time. Preferably, to obtain the difference in pinning temperatures, AFM pinning layer 924 is made of a different material than that of AFM pinning layer 918. For example, AFM pinning layer 918 may be made of platinum-manganese (PtMn) and AFM pinning layer 924 may be made of iridium-manganese (IrMn). A similar result may be achieved by utilizing the same materials for AFM pinning layers 918 and 924 with different thicknesses. More generally, the choice of any AFM material and its thickness may vary. The AFM layers may be the same material or alternatively have the same thickness. Preferably, the AFM layers are made of different materials and have different thicknesses.

Exemplary thicknesses and materials of TTM 900*a* are indicated in FIG. 9A. In-stack longitudinal bias layer structure 916 has AFM pinning layer 924 made of platinum-manganese (PtMn) with a thickness of about 150 Angstroms and pinned layer 922 made of cobalt-iron (CoFe) with a thickness of about 20 Angstroms. AFM pinning layer 918 is made of iridium-manganese (IrMn) with a thickness of about 80 Angstroms and pinned layer 912 made of cobalt-iron (CoFe) with a thickness of about 40 Angstroms. Free layer structure 914 is made of nickel-iron (NiFe) with a thickness of about 40 Angstroms.

Preferably, there is a predetermined relationship established between the magnetic thickness of the pinned layer structure 922 of LBL structure 916 and the magnetic thickness of free layer structure 914. In particular, the magnetic thickness of pinned layer structure 922 is made to be substantially the same as the magnetic thickness of free layer structure 914. However, the magnetic thickness of the pinned layer may be between 50-500% of the thickness of the free layer.

Figure 9B:
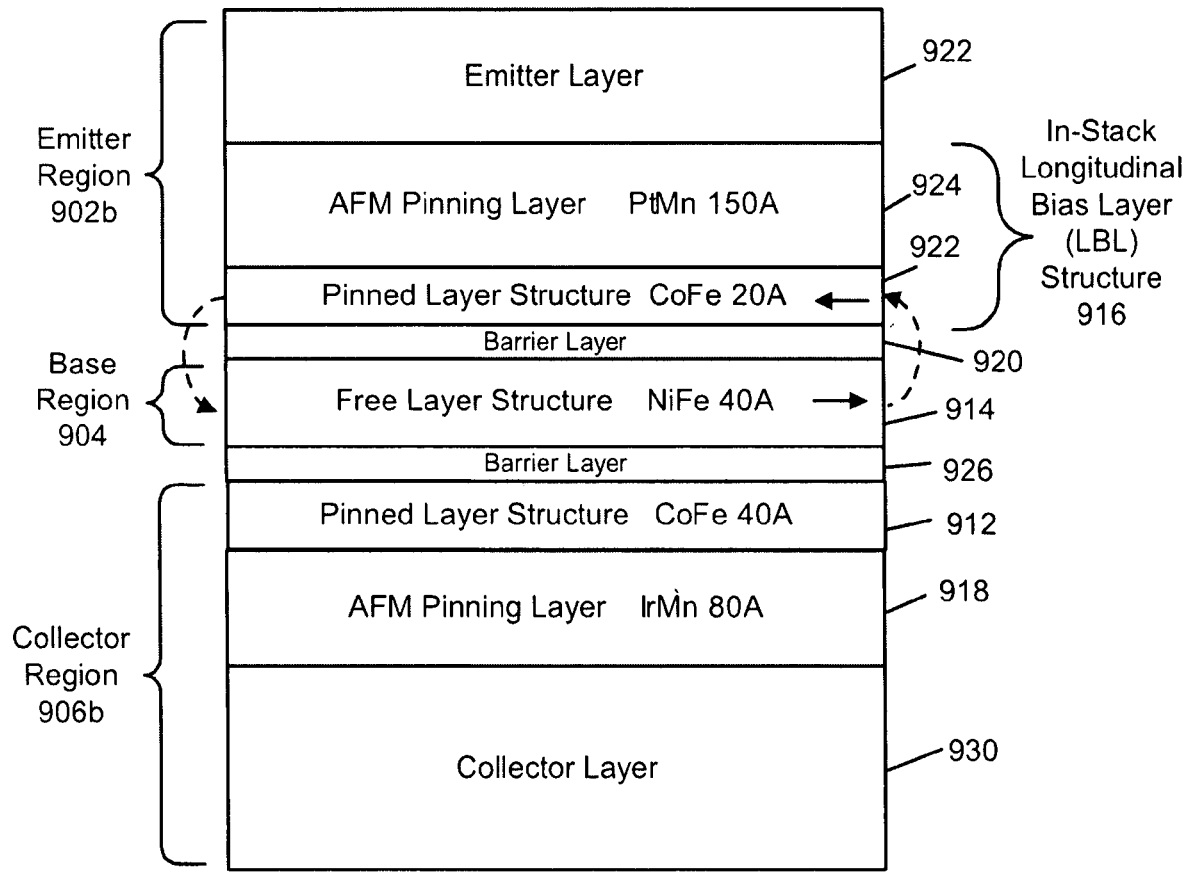
FIG. 9B is a sensor plane (or ABS) view of one variation of the embodiment of FIG. 9A, where the base region has the free layer structure, the emitter region has the in-stack LBL structure, and the collector region has the pinned layer structure.
Figure 9C:
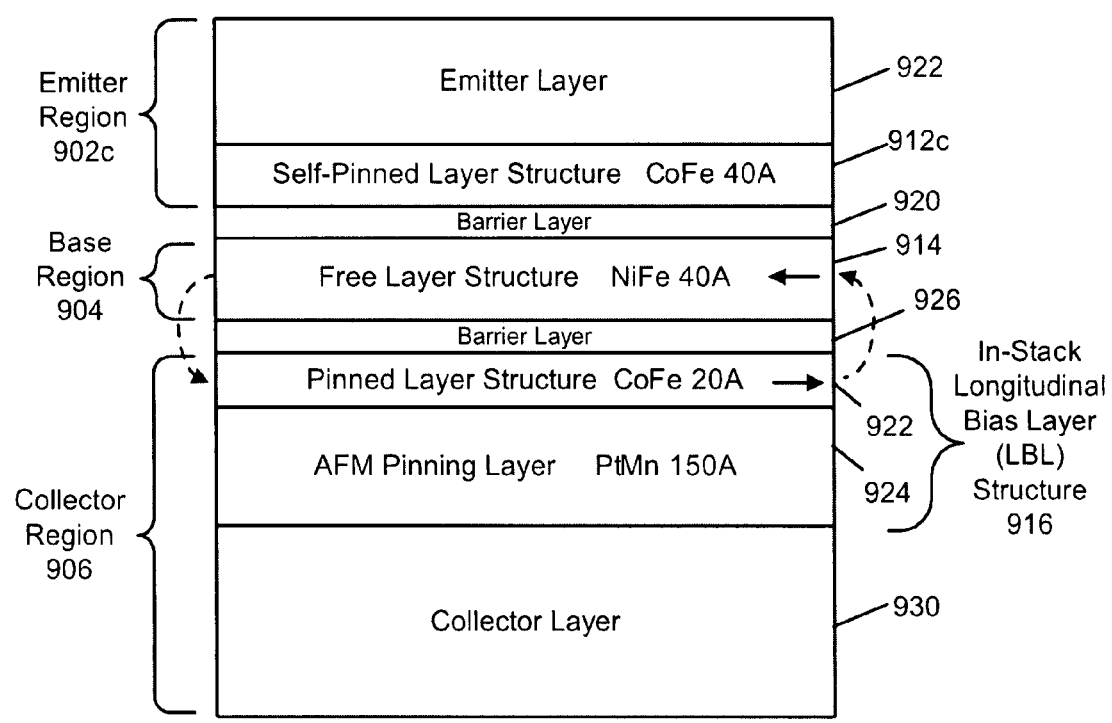
FIG. 9C is a sensor plane (or ABS) view of another variation of the embodiment of FIG. 9A, where the base region has the free layer structure, the emitter region has a self-pinned layer structure, and the collector region has the in-stack LBL structure.
Figure 9D:
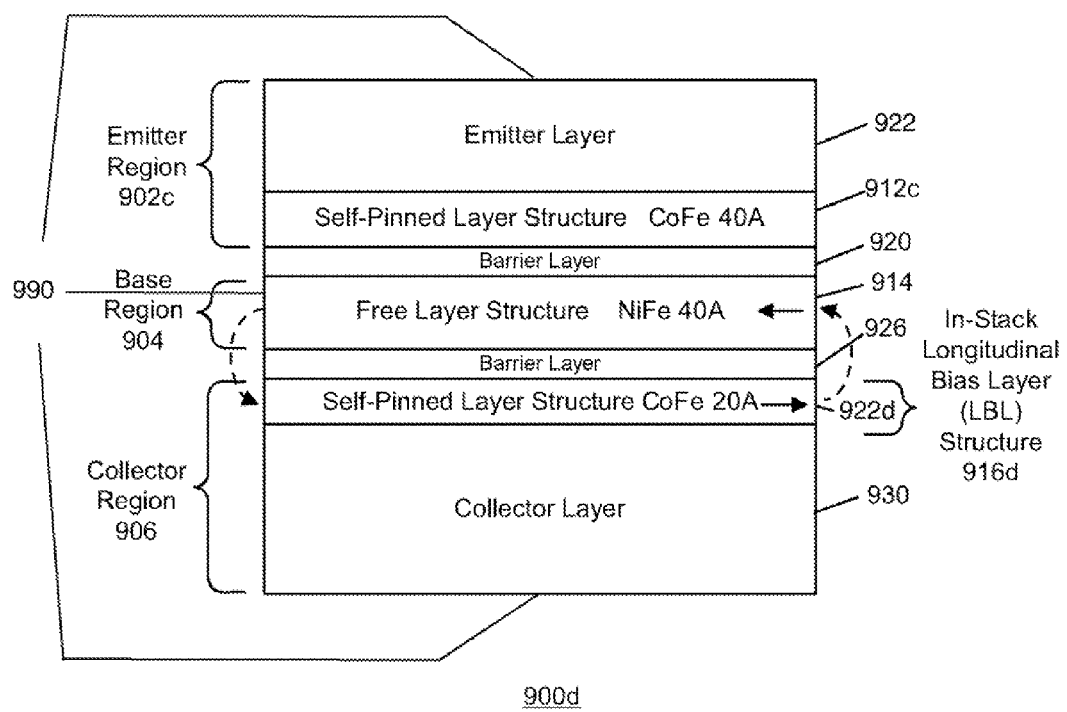
FIG. 9D is a sensor plane (or ABS) view of a variation of the embodiment of FIG. 9C, where the base region has the free layer structure, the emitter region has the self-pinned layer structure, and the collector region has the in-stack LBL structure which also includes a self-pinned layer structure.

One variation of the TTM 900*a* of FIG. 9A is a TTM 900*b* shown in FIG. 9B. TTM 900*b* of FIG. 9B is the same as TTM 900*a* of FIG. 9A except that the layers are inverted as shown, such that an emitter region 902*b* includes in-stack LBL structure 916 and collector region 906*b* includes pinned layer structure 918. Another variation of the TTM 900*a* of FIG. 9A is a TTM 900*c* shown in FIG. 9C. TTM 900*c* of FIG. 9C is the same as TIM 900*a* of FIG. 9A except that emitter region 902*c* includes a self-pinned layer structure 912*c* as the pinned layer structure. For TTM 900*c*, the AFM pinning layer 918 of the TTM 900*a* of FIG. 9A is not needed for pinning purposes. A sensor of the self-pinned type relies on magnetostriction of the self-pinned structure and the ABS stress for a self-pinning effect. The AFM pinning layer, which is typically as thick as 150 Angstroms, is no longer necessary for pinning purposes so that a thinner sensor can be made. TIM 900*d* of FIG. 9D is another structural variation where LBL structure 916*d* also has a self-pinned layer structure 922*d*. Note that TTM 900*d* has leads or terminals 990 which are coupled to the emitter region 902*c*, base region 904, and collector region 906. Note further that the self-pinned layer structure 922*d* of FIG. 9D may include one or multiple layers of materials. In this variation, structure 912*c* may or may not be self pinned.

Figure 10:
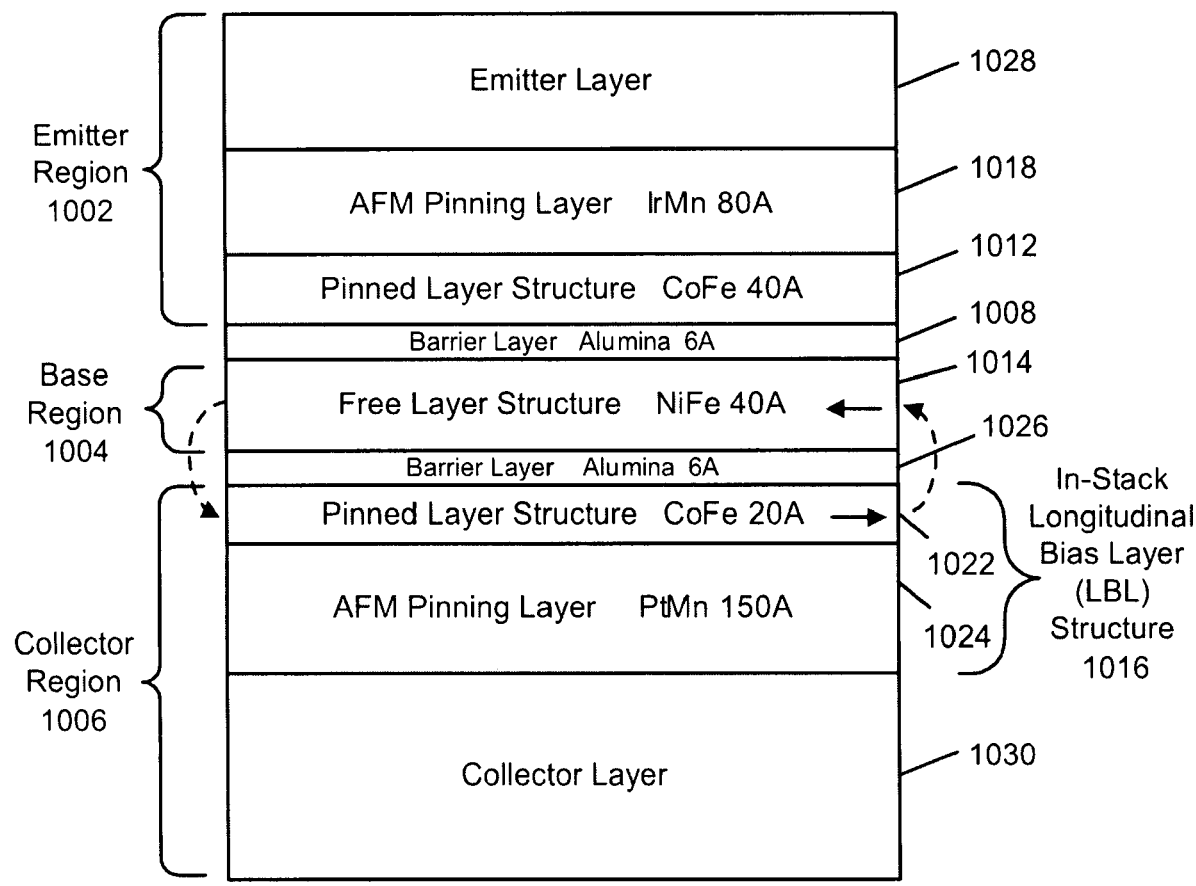
FIG. 10 is a sensor plane (or ABS) view of a final embodiment of a TTM of the double tunnel junction type which includes a base region having a free layer structure, an emitter region having a pinned layer structure, and a collector region having an in-stack LBL structure which magnetically biases the free layer structure.

FIG. 10 is a sensing plane (or ABS) view of yet another embodiment of a TTM 1000 of the present application. TTM 1000 of FIG. 10 has the general structure and functionality of the TTM shown and described above generally in relation to the drawings, with or without having the metal layer for reduced lead resistance. Specifically, TTM 1000 is a specific embodiment of that shown and described in relation to FIG. 9A and is of the double tunnel junction type. As shown in FIG. 10, TTM 1000 has an emitter region 1002, a base region 1004, and a collector region 1006. A first insulative tunnel barrier layer 1008 is located between emitter region 1002 and base region 1004, and a second insulative tunnel barrier layer 1026 is located between collector region 1006 and base region 1004. Since TTM 1000 is of the double tunnel junction type, first and barrier layers 1008 and 1026 are insulative tunnel barriers made of a suitable electrically insulative material (e.g. $Al_2O_3$ or alumina).

In this embodiment, base region 1004 consists of a free layer structure 1014. Since free layer structure 1014 is the only structure provided within base region 1004, the base region has a relatively small thickness for an improved signal in the TTM 1000. Emitter region 1002 has a pinned layer structure 1012 and an AFM pinning layer 1018. Emitter region 1002 may also have one or more other emitter layers 1028 which may be or include a silicon layer or an FM layer such as nickel-iron. Pinned layer structure 1012 is adjacent first insulative tunnel barrier layer 1008, which is in turn adjacent free layer structure 1014. As apparent, first insulative tunnel barrier layer 1008 simultaneously serves as a spacer layer between pinned layer structure 1012 and free layer structure 1014.

An FM pinned layer of pinned layer structure 1012 is magnetically pinned by exchange-coupling with AFM pinning layer 1018, which is formed adjacent pinned layer structure 1012. The pinning field generated by AFM pinning layer 1018 should be greater than demagnetizing fields to ensure that the magnetization direction of the FM pinned layer remains fixed during application of external fields (e.g. fields from bits recorded on the disk). The magnetization of free layer structure 1014 is not fixed and is free to rotate in response to the field from the information recorded on the magnetic medium (i.e. the signal field). Pinned layer structure 1012 may be a single FM layer or, alternatively, a multi-layer structure. In particular, pinned layer structure 1012 may be an AP pinned layer structure as shown and described earlier in relation to FIG. 11. The FM pinned layer of pinned layer structure 1012 may alternatively be "self-pinned" where AFM pinning layer 1018 is not needed for pinning purposes, as described earlier above.

Collector region 1006 has an in-stack LBL structure 1016. Collector region 1006 may also have one or more other collector layers 1030 which may be or include a silicon layer or an FM layer such as nickel-iron. Being formed "in-stack" with the sensor layers, LBL structure 1016 of collector region 1006 is formed within the central region of the sensor but not within side regions thereof. LBL structure 1016 includes a pinned layer structure 1022 and an AFM pinning layer 1024. Second insulative tunnel barrier layer 1026 is formed between LBL structure 1016 and free layer structure 1014, causing pinned layer structure 1022 and free layer structure 1014 to be physically separated but in close proximity to each other. As apparent, second insulative tunnel barrier layer 1026 simultaneously serves as a spacer layer for LBL structure 1016; no separate spacer layer is needed to provide such separation.

Pinned layer structure 1022 is magnetically pinned by exchange-coupling with AFM pinning layer 1024. In particular, AFM pinning layer 1024 pins a magnetic moment of pinned layer structure 1022 parallel to the ABS and parallel to the planes of the sensor layers as indicated. Because of pinned layer structure 1022, the magnetic moment of free layer structure 1014 is magnetically stabilized parallel to the ABS and parallel to the major planes of the sensor as indicated by the dashed arrows. This biasing is uniform from the sides of free layer structure 1014 so that the biasing does not cause a limitation on narrow track width sensors. Pinned layer structure 1022 may be a single FM layer or alternatively a multi-layer structure, and may include an AP pinned structure as previously shown and described in relation to FIG. 11.

Note that AFM pinning layer 1024 of LBL structure 1016 should preferably magnetically pin at a different temperature than AFM pinning layer 1018. The reason is so that, during TTM fabrication, the pinning achieved for AFM pinning layer 1024 will not be adversely affected by the subsequent pinning process utilized for AFM pinning layer 1018. As is known, the pinning of AFM pinning layers is typically achieved by heating the AFM materials to a predetermined temperature and applying a magnetic field at the same time. Preferably, to obtain the difference in pinning temperatures, AFM pinning layer 1024 is made of a different material than that of AFM pinning layer 1018. For example, AFM pinning layer 1018 may be made of platinum-manganese (PtMn) and AFM pinning layer 1024 may be made of iridium-manganese (IrMn). A similar result may be achieved by utilizing the same materials for AFM pinning layers 1018 and 1024 with different thicknesses. More generally, the choice of any AFM material and its thickness may vary. The AFM layers may be the same material or alternatively have the same thickness. Preferably, the AFM layers are made of different materials and have different thicknesses.

Exemplary thicknesses and materials of TTM 1000 are indicated in FIG. 10. In-stack longitudinal bias layer structure 1016 has AFM pinning layer 1024 made of platinum-manganese (PtMn) with a thickness of about 150 Angstroms and pinned layer 1022 made of cobalt-iron (CoFe) with a thickness of about 20 Angstroms. AFM pinning layer 1018 is made of iridium-manganese (IrMn) with a thickness of about 80 Angstroms and pinned layer 1012 made of cobalt-iron (CoFe) with a thickness of about 40 Angstroms. Free layer structure 1014 is made of nickel-iron (NiFe) with a thickness of about 40 Angstroms.

A TTM of the present application may be fabricated using conventional lithographic techniques, as now described. In the following description, a TTM of the type shown in and described in relation to FIG. 4 and FIG. 7A is specifically made; these techniques are easily applied for the fabrication of all TTM types. Referring to FIG. 12A, collector region 20 is shown with an insulating oxide layer 1010/1012 deposited thereon. A resist pattern 43 is then used to remove a middle portion of the insulating layer 1010/1012 which creates, as shown in FIG. 12B, a via 44 down to the semiconductor substrate 20 as well as insulating layers 1010 and 1012. The removal of the insulating layer materials may be performed using conventional etching techniques. Optionally, a metal layer 1050 is then formed over at least a portion of insulating layer 1012. Metal layer 1050 may be formed using sputter-deposition or electroplating steps, as well as lithography steps with a patterned resist and etching. An air bearing surface (ABS) 11 of the sensor structure is represented by a dotted line in FIGS. 13A and 13B as well as in the subsequent drawings.

In FIG. 14A, a sensor stack 18 is formed over insulating layers 1010 and 1012; into via 44, and over metal layer 1050. Sensor stack 18 includes base region 15 and emitter region 5, with the barrier regions (e.g. barrier region 10) deposited in the stack where appropriate. Behind the sensing plane, base region 15 is formed over and in contact with metal layer 1050. The top-down view of FIG. 14B illustrates the upper cap of sensor stack 18, which is top the surface of emitter region 5. Next, as depicted in FIGS. 15A and 15B, another resist 46 is used to pattern sensor stack 18, where portions of emitter region 5 are removed using known techniques such as ion milling or reactive ion etching (RIE). This exposes base layer 15 along the sides and defines the stripe height $H_S$ of the device. As shown in FIGS. 16A and 16B, an insulator 25 (such as alumina) is then filled in the areas over exposed base layer 15.

Figure 17A:
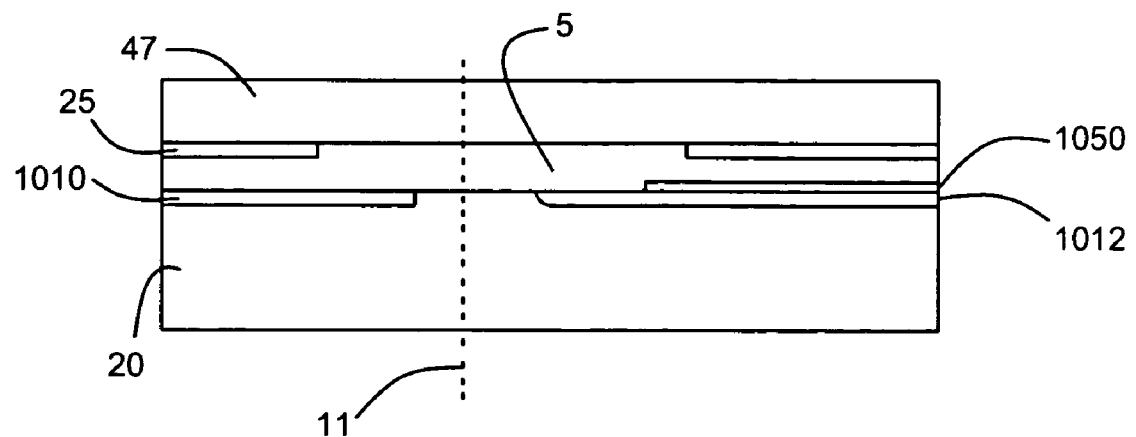
Figure 17B:
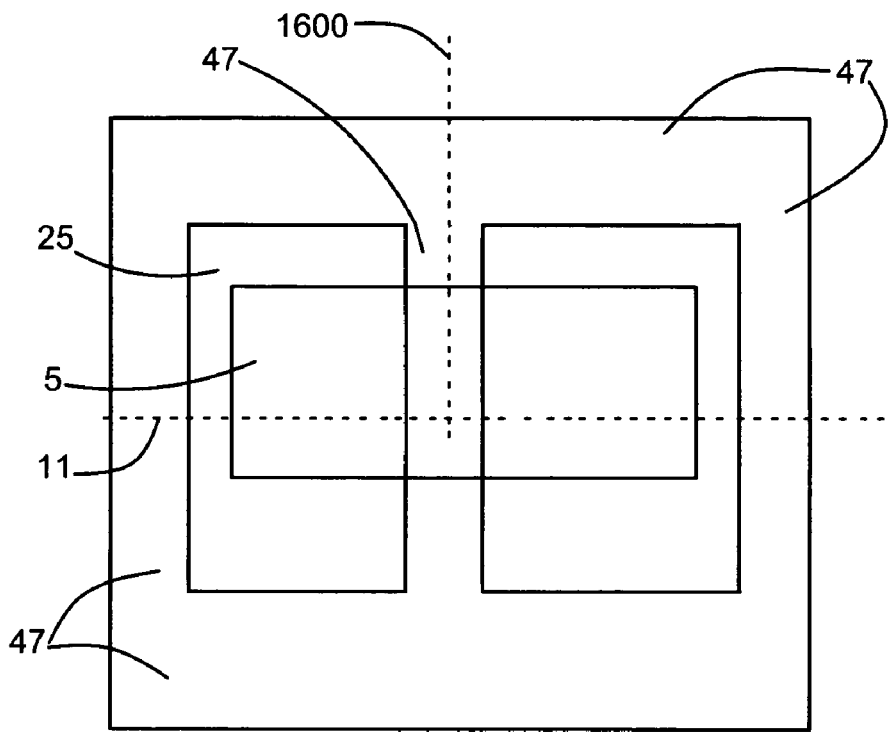
Figure 18A:
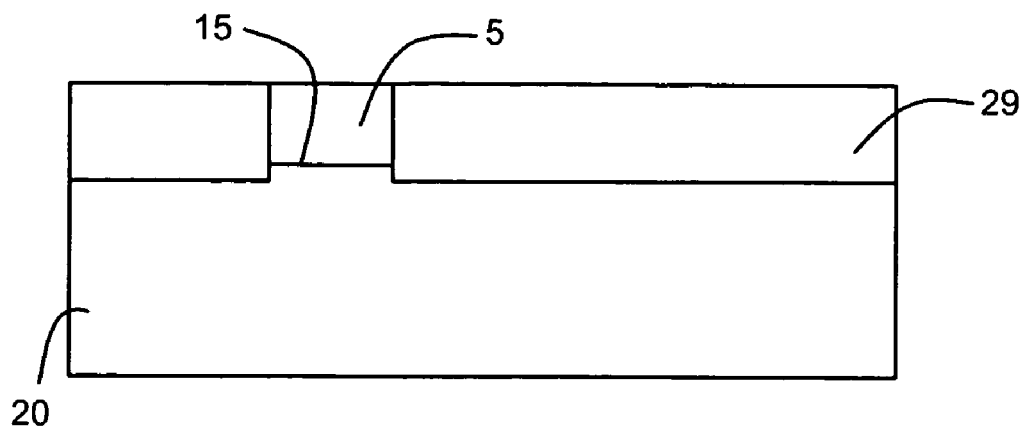
Figure 18B:
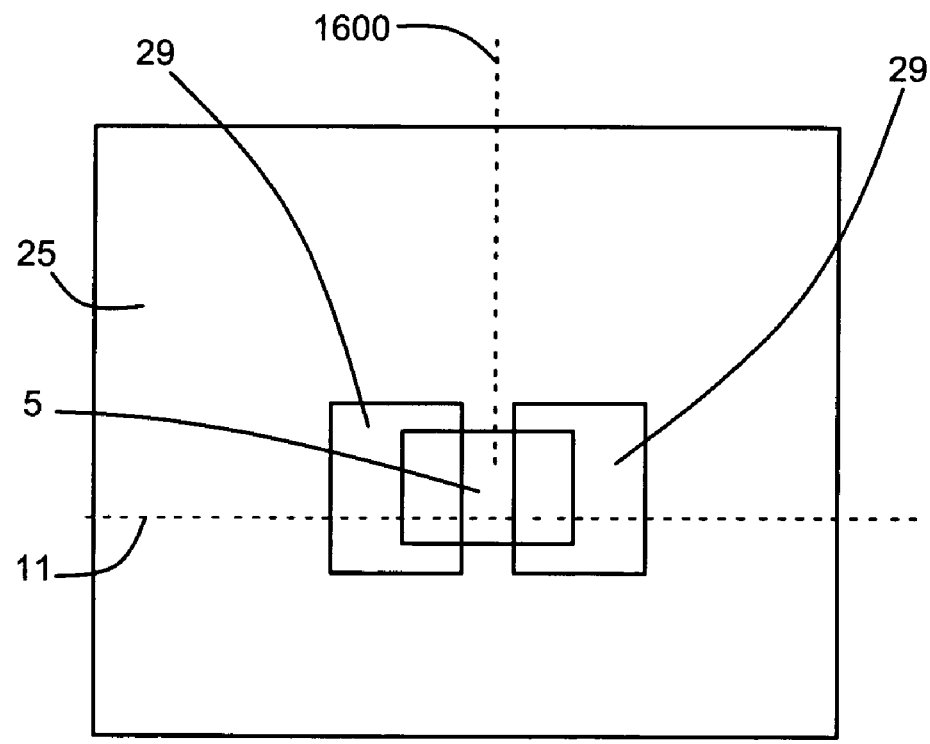
Figure 19A:
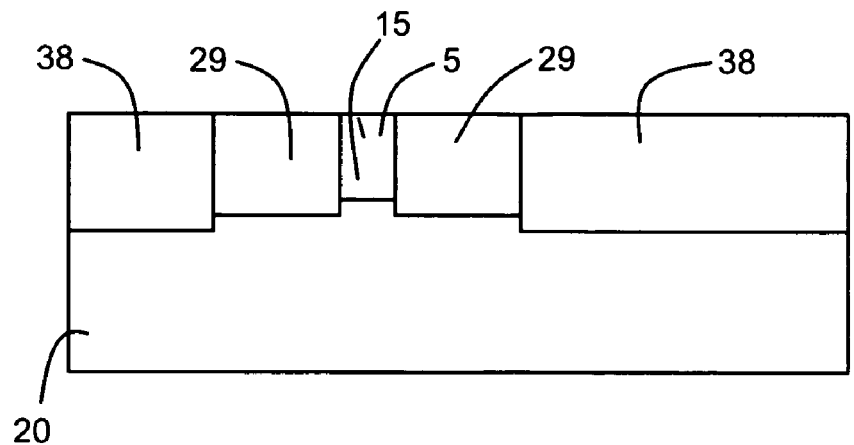
Figure 19B:
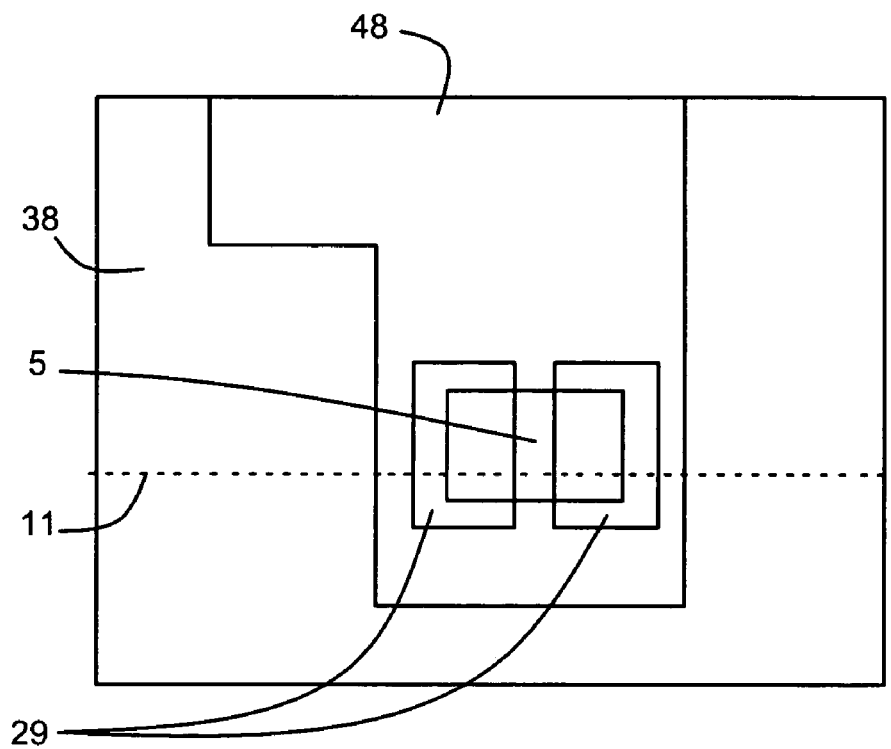

In the next stage of processing, as illustrated in FIGS. 17A and 17B, a patterned resist 47 is used to pattern the structure along a trackwidth (TW) axis 1600 with an etch. Patterned resist 47 is best viewed in the top-down view of FIG. 12B where the exposed portions of insulator 25 and emitter 5 are shown. Once the exposed material is removed, an insulating layer 29 is deposited as depicted in the ABS view of FIG. 18A and a top plan view of FIG. 18B. In the ABS view of FIG. 19A and in FIG. 19B, portions of insulator layer 29 are removed along with portions of refill alumina 25 and base region 15, such that only emitter region 5 and a remaining portion of base region 15 are located between insulator layer 29. Another resist 48 is then used to pattern the device and another insulator 38 fills the exposed portions. FIGS. 20A and 20B illustrate the device where yet another resist 49 used to pattern (etch) a via 56 to base region 15 and a via (not visible) to collector region 20. This step may etch through metal layer 1050 as shown or, alternatively, refrain from etching through metal layer 1050. After the patterning is completed, the transistor device is plated with emitter lead 35 and base lead 36 as shown in FIGS. 21A and 21B, wherein these leads 35, 36 are preferably made of nickel-iron (NiFe). Other leads, such as the collector lead (not shown) can also be included in this lead-plating step.

Final Comments. As described herein, a three terminal magnetic sensor (TTM) has a base region, a collector region, and an emitter region. A sensing plane is defined along sides of the base region, the collector region, and the emitter region. A first barrier layer is located between the emitter region and the base region, and a second barrier layer is located between the collector region and the base region. The base region includes a free layer structure. The TTM further includes a self-pinned layer structure as well as an in-stack longitudinal biasing layer (LBL) structure which magnetically biases the free layer structure. The TTM may comprise a spin valve transistor (SVT), a magnetic tunnel transistor (MTT), or a double junction structure.

A disk drive of the present application includes a slider, a magnetic head carried on the slider, a write head portion of the magnetic head, and a read head portion of the magnetic head which includes a TTM. The TTM has a base region, a collector region, and an emitter region. A sensing plane is defined along sides of the base region, the collector region, and the emitter region. A first barrier layer is located between the emitter region and the base region, and a second barrier layer is located between the collector region and the base region. The base region includes a free layer structure. The TTM further includes a self-pinned layer structure as well as an in-stack longitudinal biasing layer (LBL) structure which magnetically biases the free layer structure.

It is to be understood that the above is merely a description of preferred embodiments of the invention and that various changes, alterations, and variations may be made without departing from the true spirit and scope of the invention as set for in the appended claims. For example, although the TTM is described as a three-leaded device, it may actually have three or more leads. Few if any of the terms or phrases in the specification and claims have been given any special particular meaning different from the plain language meaning to those ordinarily skilled in the art, and therefore the specification is not to be used to define terms in an unduly narrow sense.

What is claimed is:

1. A three terminal magnetic sensor (TTM) comprising:
   a sensor stack structure comprising a base region, a collector region, and an emitter region;
   a first barrier layer located between the emitter region and the base region;
   a second barrier layer located between the collector region and the base region;

a plurality of terminals of the TTM comprising a base lead coupled to the base region, a collector lead coupled to the collector region, and an emitter lead coupled to the emitter region;

the collector region comprising a layer of semiconductor material;

the base region comprising a free layer structure made of ferromagnetic materials;

an in-stack longitudinal biasing layer structure formed in stack with the sensor stack structure and having a magnetic moment that is parallel to a sensing plane of the TTM for longitudinally biasing the free layer structure;

the in-stack longitudinal biasing layer comprising a first self-pinned layer structure which is separated from the base region by one of the first and the second barrier layers, which also serves as a spacer layer for the in-stack longitudinal biasing layer structure;

a second self-pinned layer structure which is separated from the base region by the other one of the first and the second barrier layers;

an insulator layer which is offset from the sensing plane and in between the base region and the collector region; and a layer of metal which is offset from the sensing plane and in contact with the ferromagnetic materials of the base region, the layer of metal having an electrical resistivity of less than 10 $\mu\Omega$-centimeters so that a combined electrical resistivity of the base region is between about 2-18 $\mu\Omega$-centimeters.

2. The TTM of claim 1, wherein the layer of metal comprises one of copper, gold, and ruthenium.

3. The TTM of claim 1, wherein the first and the second self-pinned layer structures rely on magnetostriction and ABS stress for a self-pinning effect.

4. The TTM of claim 1, wherein an antiferromagnetic (AFM) pinning layer is not included in either one of the first and the second self-pinned layer structures for pinning purposes.

5. The TTM of claim 1, wherein the first and the second self-pinned layer structures rely on magnetostriction and ABS stress for a self-pinning effect, where no antiferromagnetic (AFM) pinning layer is necessary in either one of the first and the second self-pinned layer structures for pinning purposes.

6. The TTM of claim 1, wherein a magnetic thickness of the first self-pinned layer structure is substantially the same as a magnetic thickness of the free layer structure.

7. The TTM of claim 1, wherein the in-stack LBL structure is part of the collector region.

8. The TTM of claim 1, wherein the in-stack LBL structure is part of the emitter region.

9. The TTM of claim 1, wherein the second self-pinned layer structure is part of the emitter region.

10. The TTM of claim 1, wherein the second self-pinned layer structure is part of the collector region.

11. The TTM of claim 1, which is employed in a magnetic head.

12. A magnetic head, comprising;

a read sensor comprising a three terminal magnetic sensor (TTM);

the TTM having:

a sensor stack structure comprising a base region, a collector region, and an emitter region;

a first barrier layer located between the emitter region and the base region;

a second barrier layer located between the collector region and the base region;

a plurality of terminals of the TTM comprising a base lead coupled to the base region, a collector lead coupled to the collector region, and an emitter lead coupled to the emitter region;

the collector region comprising a layer of semiconductor material;

the base region comprising a free layer structure made of ferromagnetic materials;

an in-stack longitudinal biasing layer structure formed in stack with the sensor stack structure and having a magnetic moment that is parallel to a sensing plane of the TTM for longitudinally biasing the free layer structure;

the in-stack longitudinal biasing layer comprising a first self-pinned layer structure which is separated from the base region by one of the first and the second barrier layers, which also serves as a spacer layer for the in-stack longitudinal biasing layer structure;

a second self-pinned layer structure which is separated from the base region by the other one of the first and the second barrier layers;

an insulator layer which is offset from the sensing plane and in between the base region and the collector region; and a layer of metal which is offset from the sensing plane and in contact with the ferromagnetic materials of the base region, the layer of metal having an electrical resistivity of less than 10 $\mu\Omega$-centimeters so that a combined electrical resistivity of the base region is between about 2-18 $\mu\Omega$-centimeters.

13. The magnetic head of claim 12, wherein the layer of metal comprises one of copper, gold, and ruthenium.

14. The magnetic head of claim 12, wherein the first and the second self-pinned layer structures rely on magnetostriction and ABS stress for a self-pinning effect.

15. The magnetic head of claim 12, wherein an antiferromagnetic (AFM) pinning layer is not included in either one of the first and the second self-pinned layer structures for pinning purposes.

16. The magnetic head of claim 12, wherein the first and the second self-pinned layer structures rely on magnetostriction and ABS stress for a self-pinning effect, where no antiferromagnetic (AFM) pinning layer is necessary in either one of the first and the second self-pinned layer structures for pinning purposes.

17. The magnetic head of claim 12, wherein a magnetic thickness of the first self-pinned layer structure is substantially the same as a magnetic thickness of the free layer structure.

18. The magnetic head of claim 12, wherein the in-stack LBL structure is part of the collector region.

19. The magnetic head of claim 12, wherein the in-stack LBL structure is part of the emitter region.

20. The magnetic head of claim 12, wherein the second self-pinned layer structure is part of the emitter region.

21. The magnetic head of claim 12, wherein the second self-pinned layer structure is part of the collector region.

22. A disk drive, comprising:

a slider;

a magnetic head carried on the slider;

a write head portion of the magnetic head;

a read head portion of the magnetic head;

the read head portion including a three terminal magnetic sensor (TTM);

the TTM including:

a sensor stack structure comprising a base region, a collector region, and an emitter region;

a first barrier layer located between the emitter region and the base region;

a second barrier layer located between the collector region and the base region;

a plurality of terminals of the TTM comprising a base lead coupled to the base region, a collector lead coupled to the collector region, and an emitter lead coupled to the emitter region;

the collector region comprising a layer of semiconductor material;

the base region comprising a free layer structure made of ferromagnetic materials;

an in-stack longitudinal biasing layer structure formed in stack with the sensor stack structure and having a magnetic moment that is parallel to a sensing plane of the TTM for longitudinally biasing the free layer structure;

the in-stack longitudinal biasing layer comprising a first self-pinned layer structure which is separated from the base region by one of the first and the second barrier layers, which also serves as a spacer layer for the in-stack longitudinal biasing layer structure;

a second self-pinned layer structure which is separated from the base region by the other one of the first and the second barrier layers;

an insulator layer which is offset from the sensing plane and in between the base region and the collector region; and a layer of metal which is offset from the sensing plane and in contact with the ferromagnetic materials of the base region, the layer of metal having an electrical resistivity of less than 10 µΩ-centimeters so that a combined electrical resistivity of the base region is between about 2-18 µΩ-centimeters.

23. The disk drive of claim 22, wherein the layer of metal comprises one of copper, gold, and ruthenium.

24. The disk drive of claim 22, wherein the first and the second self-pinned layer structures rely on magnetostriction and ABS stress for a self-pinning effect.

25. The disk drive of claim 22, wherein an antiferromagnetic (AFM) pinning layer is not included in either one of the first and the second self-pinned layer structures for pinning purposes.

26. The disk drive of claim 22, wherein the first and the second self-pinned layer structures rely on magnetostriction and ABS stress for a self-pinning effect, where no antiferromagnetic (AFM) pinning layer is necessary in either one of the first and the second self-pinned layer structures for pinning purposes.

27. The disk drive of claim 22, wherein a magnetic thickness of the first self-pinned layer structure is substantially the same as a magnetic thickness of the free layer structure.

28. The disk drive of claim 22, wherein the in-stack LBL structure is part of the collector region.

29. The disk drive of claim 22, wherein the in-stack LBL structure is part of the emitter region.

30. The disk drive of claim 22, wherein the second self-pinned layer structure is part of the emitter region.

31. The disk drive of claim 22, wherein the second self-pinned layer structure is part of the collector region.

* * * * *